US012768861B2

(12) United States Patent
Lin et al.

(10) Patent No.: US 12,768,861 B2
(45) Date of Patent: Oct. 20, 2026

(54) ADHERED MULTILAYER DIE UNIT AND PROBE HEAD, PROBE SEAT, PROBE CARD AND TEST SYSTEM INCLUDING THE SAME

(71) Applicant: MPI CORPORATION, Chu-Pei City (TW)

(72) Inventors: Sheng-Yu Lin, Chu-Pei City (TW); Shang-Jung Hsieh, Chu-Pei City (TW); Che-Wei Lin, Chu-Pei City (TW); Hsueh-Chih Wu, Chu-Pei City (TW)

(73) Assignee: MPI CORPORATION, Chu-Pei City (TW)

( * ) Notice: Subject to any disclaimer, the term of this patent is extended or adjusted under 35 U.S.C. 154(b) by 128 days.

(21) Appl. No.: 18/635,405

(22) Filed: Apr. 15, 2024

(65) Prior Publication Data

US 2025/0020692 A1 Jan. 16, 2025

Related U.S. Application Data

(60) Provisional application No. 63/459,709, filed on Apr. 17, 2023.

(30) Foreign Application Priority Data

Apr. 11, 2024 (TW) ................................ 113203557

(51) Int. Cl.
*G01R 1/073* (2006.01)
*G01R 31/28* (2006.01)

(52) U.S. Cl.
CPC ..... *G01R 1/07342* (2013.01); *G01R 31/2886* (2013.01)

(58) Field of Classification Search
CPC ............ G01R 1/07342; G01R 1/07357; G01R 31/2886; G01R 31/26; H10K 2102/331; H10K 71/00; H10K 71/60; H10K 77/111; H10W 70/24; H10W 70/417; H10N 50/80; H10N 50/85
See application file for complete search history.

(56) References Cited

U.S. PATENT DOCUMENTS

| | | | | |
|---|---|---|---|---|
| 8,933,719 | B2 * | 1/2015 | Huang | G01R 1/07342 73/866.5 |
| 9,535,091 | B2 * | 1/2017 | Hsu | G01R 1/07357 |
| 10,670,630 | B2 * | 6/2020 | Hsieh | G01R 1/0735 |
| 10,845,388 | B2 * | 11/2020 | Lee | G01R 1/07378 |

* cited by examiner

*Primary Examiner* — Vinh P Nguyen
(74) *Attorney, Agent, or Firm* — Birch, Stewart, Kolasch & Birch, LLP

(57) ABSTRACT

An adhered multilayer die unit includes at least one probe zone and at least one non-probe zone for probes to be inserted in the probe zone. The adhered multilayer die unit includes dies and at least one adhesive layer. Each die includes at least one connecting surface, and through holes in the at least one probe zone for the probes to be inserted through the through holes of each die. The at least one adhesive layer adheres the connecting surfaces of the dies to each other. The at least one adhesive layer is entirely in the at least one non-probe zone. Accordingly, the adhered multilayer die unit of the invention has great structural strength in large-area condition, avoids drilling process difficulty problem and size restriction of fastening combining manner, avoids adhesive spillage and its affection on probes, and avoids adhesive-caused problems of adhesive spillage and die levelness deviation.

17 Claims, 16 Drawing Sheets

ADHERED MULTILAYER DIE UNIT AND PROBE HEAD, PROBE SEAT, PROBE CARD AND TEST SYSTEM INCLUDING THE SAME

BACKGROUND OF THE INVENTION

1. Field of the Invention

The present invention relates to die units of probe heads of probe cards and more particularly, to an adhered multilayer die unit, and a probe head, a probe seat, a probe card and a test system, which include the adhered multilayer die unit.

2. Description of the Related Art

Referring to FIG. 17, the conventional probe card 10 primarily includes a main circuit board 11, and a probe head 12 directly connected with the main circuit board 11 or indirectly connected with the main circuit board 11 through a space transformer (not shown). The probe head 12 primarily includes a probe seat 16 composed of an upper die 13 and a lower die 14 or composed of an upper die 13, a middle die 15 and a lower die 14, and many probes 17 inserted through the probe seat 16. The large-area probe card 10 is primarily provided for testing multiple devices under test 18 at the same time, so as to enhance the testing efficiency and reduce the testing cost. Therefore, the probe head 12 of the large-area probe card 10 requires large-area dies (i.e. upper and lower dies 13, 14 or upper, middle and lower dies 13, 15, 14) for being inserted with a large number of probes 17 corresponding to multiple devices under test 18. For making the large-area die have sufficient structural strength, the thickness of the die has to be correspondingly increased as well. However, if the die is too thick, it will cause the through holes of the die with a large aspect ratio, resulting in difficulty in the drilling process.

SUMMARY OF THE INVENTION

In view of the above deficiencies, the present invention provides a multilayer die unit, which is composed of a plurality of dies piled on one another, such that the dies can be drilled individually before the dies are combined into the die unit, thereby avoiding the problem of difficulty in the drilling process and making the die unit a great structural strength. However, as to the manner of combining the dies, if the combining is performed by fastening members such as bolts, there will be size restriction, depending on the fastening members and the size of the region of the dies for disposing the fastening members. If the dies are adhered by adhesive, the aforementioned size restriction of the fastening combining manner can be avoided. But it should be careful of the position the adhesive is disposed at and the quantity of the adhesive, so as to avoid adhesive spillage and its affection on the surrounding probes, or levelness deviation of the dies caused by too large quantity of the adhesive.

In view of the above deficiencies, it is a primary objective of the present invention to provide an adhered multilayer die unit, which has a great structural strength in the large-area condition, can avoid the problem of difficulty in the drilling process and the size restriction of the fastening combining manner, and can avoid adhesive spillage and its affection on the probes.

In view of the above deficiencies, it is another objective of the present invention to provide an adhered multilayer die unit, which can avoid the problems of adhesive spillage and levelness deviation of the dies caused by adhesive.

To attain the above primary objective, the present invention provides an adhered multilayer die unit for a probe head of a test system for performing a functional test to a device under test integrated on a semiconductor wafer. The adhered multilayer die unit comprises at least one probe zone and at least one non-probe zone. The probe zone is adapted for being inserted with a plurality of probes. The adhered multilayer die unit comprises a plurality of dies and at least one adhesive layer. Each die comprises at least one connecting surface, and a plurality of through holes located in the at least one probe zone for the probes to be slidably inserted through the through holes of each die. The at least one adhesive layer adheres the connecting surfaces of the dies to each other. The at least one adhesive layer is entirely located in the at least one non-probe zone.

Wherein, the adhered multilayer die unit in the present invention is a multilayer die unit composed of a plurality of dies adhered to each other by the adhesive layer. As a result, each die among the plurality of dies can be drilled individually to be formed with the through holes in the probe zone, and then adhesive is applied in the non-probe zone to be formed into the adhesive layer so as to adhere the dies into the die unit, such that the problem of difficulty in the drilling process due to the increased thickness of a single die, which provides great structural strength, can be avoided and the size restriction of the fastening combining manner can be also avoided. Besides, the multiple layers of dies are piled on one another to attain a quite large thickness, making the die unit a great structural strength in the large-area condition. Besides, the die unit can be divided into the probe zone and the non-probe zone. The non-probe zone is not provided with any probe. The adhesive layer being entirely located in the non-probe zone can avoid adhesive spillage and its affection on the probes. In this way, a die unit is provided, and even if it has large area for being inserted with a large number of probes corresponding to multiple devices under test, it can be ensured to have great die unit structural strength and can also avoid the problem of difficulty in the drilling process and the size restriction of the fastening combining manner, and adhesive spillage and its affection on the probes can be avoided. As a result, the present invention can enhance the production efficiency and the product quality for the large-area probe card, especially the dies in the probe head thereof.

Preferably, the adhered multilayer die unit includes a plurality of probe zones arranged in a matrix, and a non-probe zone located on the periphery of the plurality of probe zones.

As a result, the probe zones can be centralized to be arranged in the central region of the die unit, and the peripheral region of the die unit serves as the non-probe zone, such that the probe zones and the non-probe zone are separated quite clearly, making the adhesive disposed in the non-probe zone improbable to affect the probes, and such non-probe zone is adapted for the adhesive to be distributed in large area to attain great adhering effect.

Preferably, the adhered multilayer die unit includes a plurality of probe zones and a plurality of non-probe zones, which are distributed in a staggered manner. The plurality of probe zones and the plurality of non-probe zones are collectively arranged in a matrix.

As a result, such die unit is adapted for the testing manner of testing the non-adjacent devices under test at the same time (usually called skipping DUT). Every two probe zones are provided therebetween with a non-probe zone for the adhesive to be disposed therein, which can attain great adhering effect.

Preferably, the adhered multilayer die unit includes a plurality of non-probe zones arranged in a matrix, and a probe zone. The probe zone is distributed in a grid pattern on the periphery of the plurality of non-probe zones and between the non-probe zones.

As a result, the probes can be distributed in a grid pattern to form multiple non-probe zones surrounded by the probes, which can make the adhesive distributed relatively evener to attain great adhering effect.

Preferably, the connecting surfaces of the dies of the adhered multilayer die unit include a first connecting surface and a second connecting surface, which are adhered to each other. The first connecting surface includes at least one protrusion located in the at least one non-probe zone. The second connecting surface is a plane. The protrusion of the first connecting surface is adhered to the second connecting surface by the adhesive layer.

As a result, for the two connecting surfaces adhered to each other, one of them may be a plane, and the other one has protruding shape in the non-probe zone with respect to the probe zone, such that the adhesive can be applied on the protrusion before the protrusion is connected with the plane. This manner can make the position for disposing the adhesive relatively more specific, further avoiding the adhesive spillage problem.

Preferably, the connecting surfaces of the dies of the adhered multilayer die unit include a first connecting surface and a second connecting surface, which are adhered to each other. The first connecting surface includes at least one protrusion located in the at least one non-probe zone. The second connecting surface includes at least one recess located in the at least one non-probe zone. The protrusion of the first connecting surface is adhered in the recess of the second connecting surface by the adhesive layer.

As a result, for the two connecting surfaces adhered to each other, one of them may has protruding shape in the non-probe zone with respect to the probe zone. On the contrary, the other one has recessed shape in the non-probe zone with respect to the probe zone, such that the adhesive can be applied on the protrusion before the protrusion is connected with the recess. This manner can make the position for disposing the adhesive relatively more specific, further avoiding the adhesive spillage problem. Besides, when the connecting surfaces are adhered, the adhesive is located in the recess, further improbable to have the problem that the adhesive spills to the probe zone. In addition, the two connecting surfaces having the embedding structure with the corresponding protrusion and recess makes the alignment for assembly relatively easier.

Preferably, the connecting surfaces of the dies of the adhered multilayer die unit include a first connecting surface and a second connecting surface, which are adhered to each other. At least one of the first connecting surface and the second connecting surface is provided with at least one flow guiding groove in the non-probe zone. The at least one flow guiding groove is configured to define an adhesive applying region. The at least one flow guiding groove is located between the adhesive applying region and the probe zone. The adhesive layer is located in the adhesive applying region.

As a result, the adhesive can be applied in the adhesive applying region, and then adhere the first and second connecting surfaces to each other. This manner can make the position for disposing the adhesive relatively more specific, further avoiding the adhesive spillage problem. Besides, the adhesive can slightly go beyond the adhesive applying region to flow into the flow guiding groove, and meanwhile the flow guiding groove prevents the adhesive from further spread, thereby further ensuring that the adhesive will not spill to the probe zone to affect the probes.

Preferably, the at least one flow guiding groove includes a closed flow guiding groove forming a closed loop.

As a result, the closed flow guiding groove can generate great adhesive stopping effect, thereby achieving a great effect of avoiding adhesive spillage.

Preferably, the at least one flow guiding groove includes a plurality of disconnected flow guiding grooves. The plurality of disconnected flow guiding grooves form a disconnected loop.

As a result, the adhesive can still flow through the gaps between the disconnected flow guiding grooves, which can slightly broaden the distribution area of the adhesive to generate great adhering effect. Meanwhile, the disconnected flow guiding grooves can still effectively stop the adhesive to attain the effect of avoiding adhesive spillage.

Preferably, the at least one flow guiding groove includes at least one inner flow guiding groove forming a loop, and at least one outer flow guiding groove surrounding the at least one inner flow guiding groove.

As a result, the inner and outer flow guiding grooves can generate greater adhesive stopping effect than a single loop of flow guiding groove. The inner and outer flow guiding grooves can be the aforementioned closed flow guiding groove or disconnected flow guiding grooves, which can be arranged according to requirements.

Preferably, the at least one flow guiding groove includes a plurality of inner flow guiding grooves forming a disconnected loop, and a plurality of outer flow guiding grooves disconnectedly surrounding the plurality of inner flow guiding grooves. Every two adjacent inner flow guiding grooves have a gap therebetween. The outer flow guiding grooves are located correspondingly to the gaps.

As a result, the inner and outer flow guiding grooves form a complementary effect. In the case that the adhesive is applied in the area surrounded by the inner flow guiding grooves, the adhesive can still flow through the gaps between the inner flow guiding grooves, which can slightly broaden the distribution area of the adhesive to generate great adhering effect. Meanwhile, the outer flow guiding grooves, because of being located correspondingly to the gaps between the inner flow guiding grooves, can effectively stop the adhesive from overly spreading outward. Similarly, in the case that the adhesive is applied outside the area surrounded by the outer flow guiding grooves, the adhesive can still flow inward through the gaps between the outer flow guiding grooves, and then the adhesive is stopped by the inner flow guiding grooves from overly spreading inward. It can be understood that this configuration can attain great adhering effect, and can effectively avoid the adhesive spillage problem.

Preferably, the flow guiding groove penetrates through the die the flow guiding groove belongs to.

As a result, the position of the flow guiding groove can be recognized from another surface of the die opposite to the connecting surface, attaining great alignment effect.

Preferably, the flow guiding groove is recessed from the connecting surface the flow guiding groove is located on.

As a result, the flow guiding groove only has an opening on the connecting surface, which can prevent the adhesive from flowing to another surface of the die opposite to the connecting surface.

Preferably, at least one of the first connecting surface and the second connecting surface is further provided with at least one adhesive dropping recess in the non-probe zone. The adhesive dropping recess is located in the adhesive applying region.

As a result, the adhesive can be dropped in the adhesive dropping recess and then smeared, or spread when the dies are pressed for combination, to other parts of the adhesive applying region, such that the thickness of the adhesive layer can be easily controlled and thereby levelness deviation of the dies is avoided. Besides, there is a specific and easily recognizable position for dropping the adhesive, which can make the adhesive dropping process performed relatively more precisely. In addition, the adhesive will be partially congregated in the adhesive dropping recess, so that the connecting surfaces of the dies don't need large-area adhesive distribution and can be still effectively adhered and fixed.

Preferably, the dies of the adhered multilayer die unit include an inner layer die and two outer layer dies. The inner layer die includes two connecting surfaces facing toward opposite directions. The outer layer dies are adhered to the connecting surfaces of the inner layer die respectively. The outer layer dies are each provided with the flow guiding groove. The flow guiding groove penetrates through the outer layer die.

As a result, the adhesive can be applied on the connecting surfaces of the inner layer die, and then adhere the connecting surfaces of the outer layer dies with the connecting surfaces of the inner layer die respectively, such that the position of the flow guiding groove can be recognized from another surface of the outer layer die opposite to the connecting surface (i.e. the outer surface of the die unit), attaining great alignment effect.

Preferably, the dies of the adhered multilayer die unit include at least two positionally limiting dies and at least one alignment die. The positionally limiting dies and the alignment die are piled on one another in a staggered manner. The through holes of the alignment die are larger in width than the through holes of the positionally limiting die.

As a result, the through holes of the positionally limiting die can be provided with the width in coordination with the width of the probes for controlling the moving action of the probes. The through holes of the alignment die having relatively larger width is beneficial for alignment, so as to avoid that there is a through hole aligned inaccurately, thereby making the action of the probe affected by the burr of the through hole.

The present invention further provides a probe head which includes an upper die unit, a lower die unit, and a plurality of probes. Each probe is inserted through the upper die unit and the lower die unit. Wherein, at least one of the upper die unit and the lower die unit is the above-described adhered multilayer die unit.

As a result, the upper die unit and/or lower die unit of the probe head can adopt the above-described adhered multilayer die unit provided by the present invention, so as to attain great structural strength and levelness in the large-area condition.

The present invention further provides a probe seat which includes an upper die unit, a lower die unit, a supporting structure, and an accommodating space. The upper die unit includes an upper surface, a lower surface, and a plurality of upper through holes penetrating through the upper surface and the lower surface of the upper die unit. The lower die unit includes an upper surface, a lower surface, and a plurality of lower through holes penetrating through the upper surface and the lower surface of the lower die unit. The supporting structure includes a plurality of supporting pillars. The plurality of supporting pillars are disposed between the upper die unit and the lower die unit. The accommodating space is formed around the plurality of supporting pillars and between the upper die unit and the lower die unit. The accommodating space is adapted for a plurality of probes to be inserted through the upper through holes respectively, inserted through the accommodating space, and inserted through the lower through holes respectively. The plurality of supporting pillars include a plurality of upper supporting pillars and a plurality of lower supporting pillars. The upper supporting pillars protrude out of the lower surface of the upper die unit along a vertical axis. The lower supporting pillars protrude out of the upper surface of the lower die unit along the vertical axis. The upper supporting pillars are in contact with the lower supporting pillars respectively. At least one of the upper die unit and the lower die unit is the above-described adhered multilayer die unit provided with the flow guiding groove. The flow guiding groove of the adhered multilayer die unit and the adhesive applying region defined thereby at least partially correspond in position to at least one of the upper supporting pillars and the lower supporting pillars of the supporting structure along the vertical axis.

As a result, the probe seat provided by the present invention may have a middle die, and the accommodating space for accommodating the probes is formed in the middle die. Alternatively, there may be no middle die, and the accommodating space for accommodating the probes is formed by the combination of the upper and lower die units directly connected with each other. In the accommodating space, where no probe is disposed can be arranged with the upper and lower supporting pillars. The upper and lower supporting pillars protrude from the upper and lower die units respectively, and are in contact with each other. Such upper and lower supporting pillars enhance the structural strength of the upper and lower die units respectively. Besides, when the upper and lower die units are connected with each other, the upper and lower supporting pillars further collectively strengthen the part of the central section of the probe seat with the accommodating space and the resulting lower structural strength. Therefore, the probe seat, even in the large-area condition, is great in structural strength and thereby uneasy to be deformed, so that the deformation of the lower die unit caused by the reacting force from the device under test will be reduced. In addition, the upper die unit and/or the lower die unit being the above-described adhered multilayer die unit can attain great structural strength and levelness in the large-area condition, and the adhered multilayer die unit having the above-described flow guiding groove can further ensure that the adhesive will not spill to the probe zone to affect the probes. Furthermore, the flow guiding groove and the adhesive applying region defined thereby at least partially correspond in position to the upper supporting pillar and/or the lower supporting pillar along the vertical axis, which means the flow guiding groove and the adhesive applying region defined thereby are at least partially located right above or right below the upper supporting pillar and/or the lower supporting pillar, such that the upper supporting pillar and/or the lower supporting pillar can directly generate structure strengthening effect to where the flow guiding groove and the adhesive applying region are located, making the die unit relatively more uneasy to be deformed by the received force.

The present invention further provides a probe head which includes the above-described probe seat having the supporting structure, and a plurality of probes. Each probe is inserted through the upper die unit and the lower die unit.

As a result, the probe head adopting the above-described probe seat not only has the supporting structure, but also adopts the adhered multilayer die unit having the flow guiding groove, and the supporting structure directly generates structure strengthening effect to where the flow guiding groove and the adhesive applying region are located. Therefore, great structural strength and levelness can be attained in the large-area condition, and the adhesive spillage problem is effectively avoided.

The present invention further provides a probe card for performing a functional test to a device under test. The probe card includes an interface board, a space transformer, and an above-described probe head. The interface board is arranged to interface with a test apparatus. The space transformer is associated with the interface board and adapted for providing space transformation in interval between contact pads formed on two opposite surfaces of the space transformer. The probe head is associated with the space transformer.

As a result, the probe card of the present invention can be a large-area probe card so as to enhance the testing efficiency and reduce the testing cost, and the probe head of the probe card adopting the above-described adhered multilayer die unit provided by the present invention can attain great structural strength and levelness in the large-area condition, so as to generate accurate testing results.

The present invention further provides a test system for testing at least one device under test. The device under test includes a plurality of electrically conductive contacts. The test system includes a chuck for supporting the device under test, a probe card, and a tester. The probe card includes an above-described probe head for the probes of the probe head to be in contact with the electrically conductive contacts of the device under test to make the probe card electrically connected with the device under test. The tester is electrically connected with the probe card for generating a test signal for the probe card to transmit the test signal to the device under test, and receiving a result signal through the probe card and analyzing the result signal.

As a result, the probe card in the test system can be a large-area probe card so as to enhance the testing efficiency and reduce the testing cost, and the probe head of the probe card adopting the above-described adhered multilayer die unit provided by the present invention can attain great structural strength and levelness in the large-area condition, so as to make the test system generate accurate testing results.

The detailed structure, features, assembly or usage of the adhered multilayer die unit, probe head, probe seat, probe card and test system provided by the present invention will be described in the following detailed description of embodiments. However, those skilled in the field of the present invention should understand that the detailed descriptions and specific embodiments instanced for implementing the present invention are given by way of illustration only, not intended to limit the scope of the claims of the present invention.

DETAILED DESCRIPTION OF THE INVENTION

Figure 1:
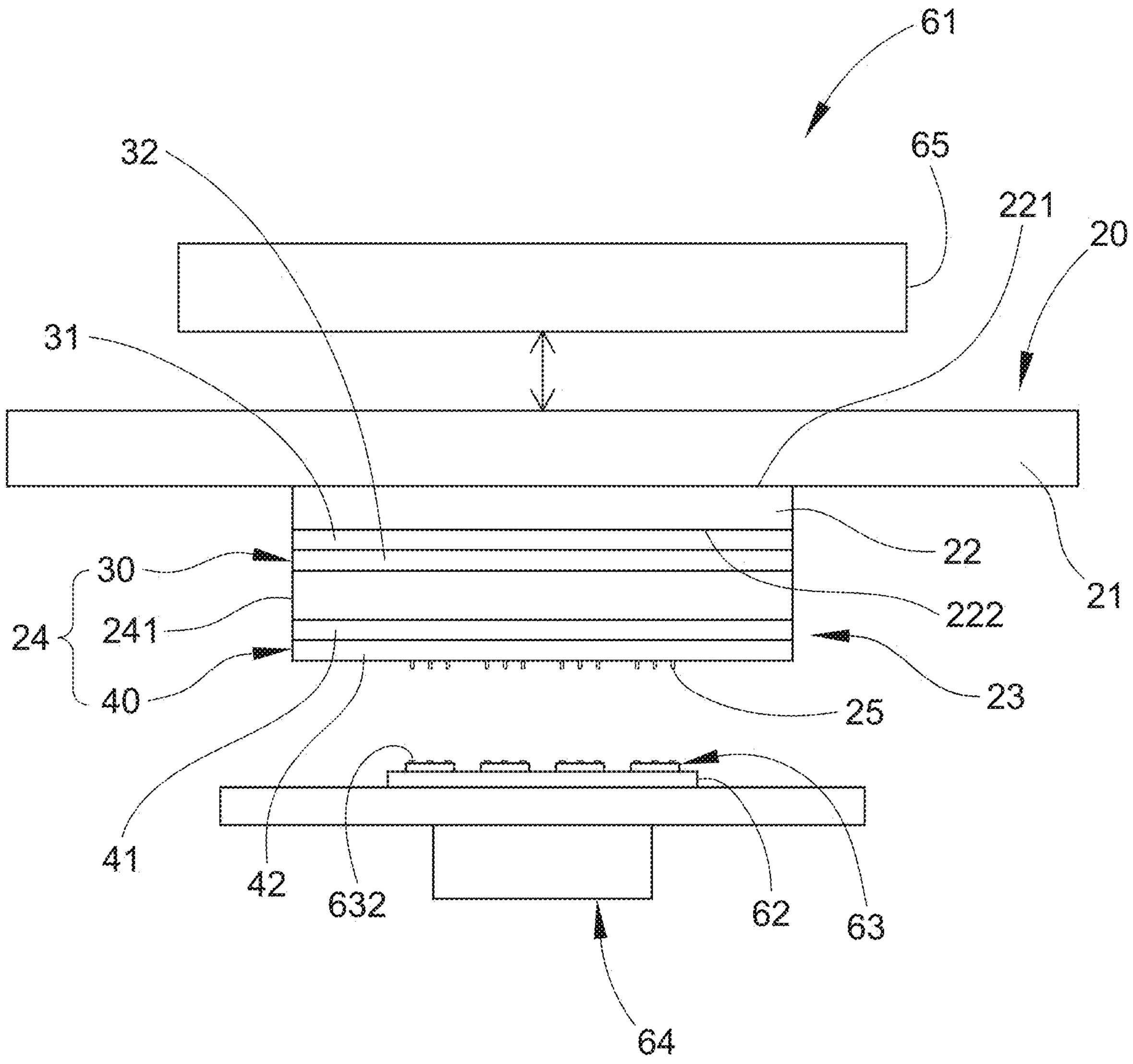
FIG. 1 is a schematic view of a test system provided by a first preferred embodiment of the present invention.

First of all, it is to be mentioned that same reference numerals used in the following embodiments and the appendix drawings designate same or similar elements or the structural features thereof. It should be noticed that for the convenience of illustration, the components and the structure shown in the figures are not drawn according to the real scale and amount, and the features mentioned in each embodiment can be applied in the other embodiments if the application is possible in practice. Besides, when it is mentioned that an element is disposed on another element, it means that the former element is directly disposed on the latter element, or the former element is indirectly disposed on the latter element through one or more other elements between aforesaid former and latter elements. When it is mentioned that an element is directly disposed on another element, it means that no other element is disposed between aforesaid former and latter elements.

Referring to FIG. 1, a first preferred embodiment of the present invention provides a test system 61 for testing at least one device under test (also referred to as DUT). Four devices under test 63 formed on a substrate 62 are schematically shown in FIG. 1. Each device under test 63 includes a plurality of electrically conductive contacts 632. The test system 61 includes a chuck 64 for supporting the devices under test 63, a probe card 20, and a tester 65. The probe card 20 is adapted for being electrically connected with and/or mechanically contacting a device under test, and adapted for testing the electrical performance of the device under test. The probe card 20 can be arranged for testing the device under test (i.e. device under test 63) which can be formed on a substrate 62. The device under test can be a wafer-level circuit, the examples of which include semiconductor device, electronic device and/or optoelectronic device. The device under test can be formed on the substrate 62. The examples of the substrate 62 include wafer, semiconductor wafer, silicon wafer, gallium arsenide wafer and/or type III-V semiconductor wafer. In some embodiments, the device under test may be, for example, a tested semiconductor device and/or an unpackaged semiconductor device. The chuck 64 is adapted to support the substrate 62 and the device under test for being tested by the probe card 20. The device under test may include one or multiple contact pads (such as an electrically conductive contact 632 shown in FIG. 1), so that the probe tips are arranged to be in contact with the one or multiple contact pads during the device under test is tested.

The probe card 20 includes an interface board 21 (also called main circuit board), a space transformer 22, and a probe head 23. The interface board 21 is arranged to interface with the tester 65. The space transformer 22 is associated with the interface board 21. The probe head 23 is associated with the space transformer 22. The aforementioned term 'associated' refers to a component is connected with another component (directly or indirectly), unlimited to be connected in a firm manner. The space transformer 22 is adapted for providing space transformation in interval between contact pads (not shown) formed on two opposite surfaces 221, 222 of the space transformer, which means the interval between the contact pads formed on the surface 221 for the connection with the interface board 21 is unequal to the interval between the contact pads formed on the surface 222 for the connection with the probe head 23. The probe head 23 includes a probe seat 24, and a plurality of probes 25 inserted through the probe seat 24. By the probe 25 contacting the electrically conductive contact 632 of the device under test 63, the probe card 20 can be electrically connected with the device under test 63. Besides, the tester 65 is electrically connected with the probe card 20 for generating a test signal for the probe card 20 to transmit the test signal to the device under test 63, and receiving a result signal through the probe card 20 and analyzing the result signal. In other words, the probe card 20 is adapted to make the device under test 63 electrically connected with the tester 65, so as to perform a functional test to the device under test 63.

Figure 15:
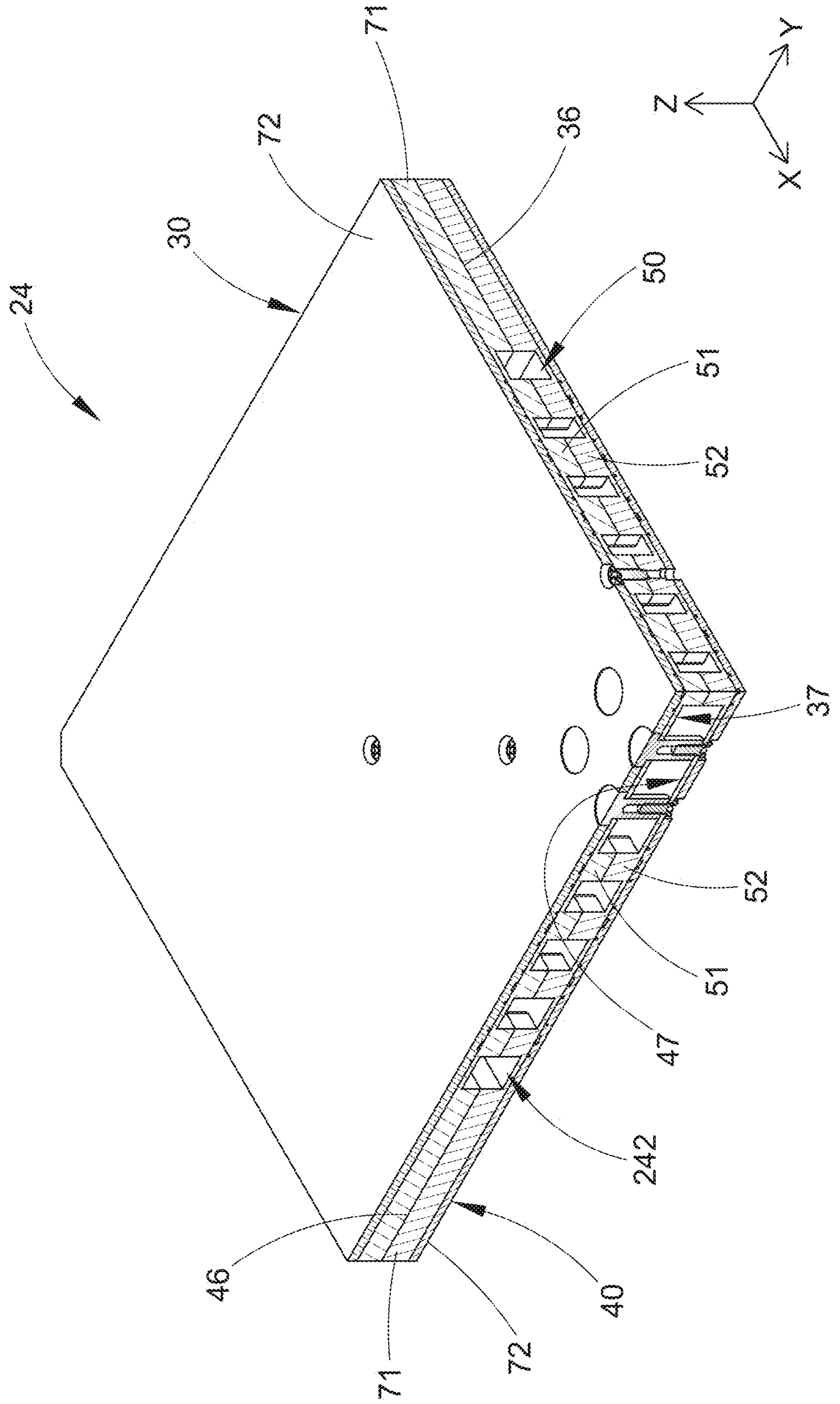
FIG. 15 is a partially cut-off perspective view of a probe seat provided by a fourth preferred embodiment of the present invention.
Figure 16:
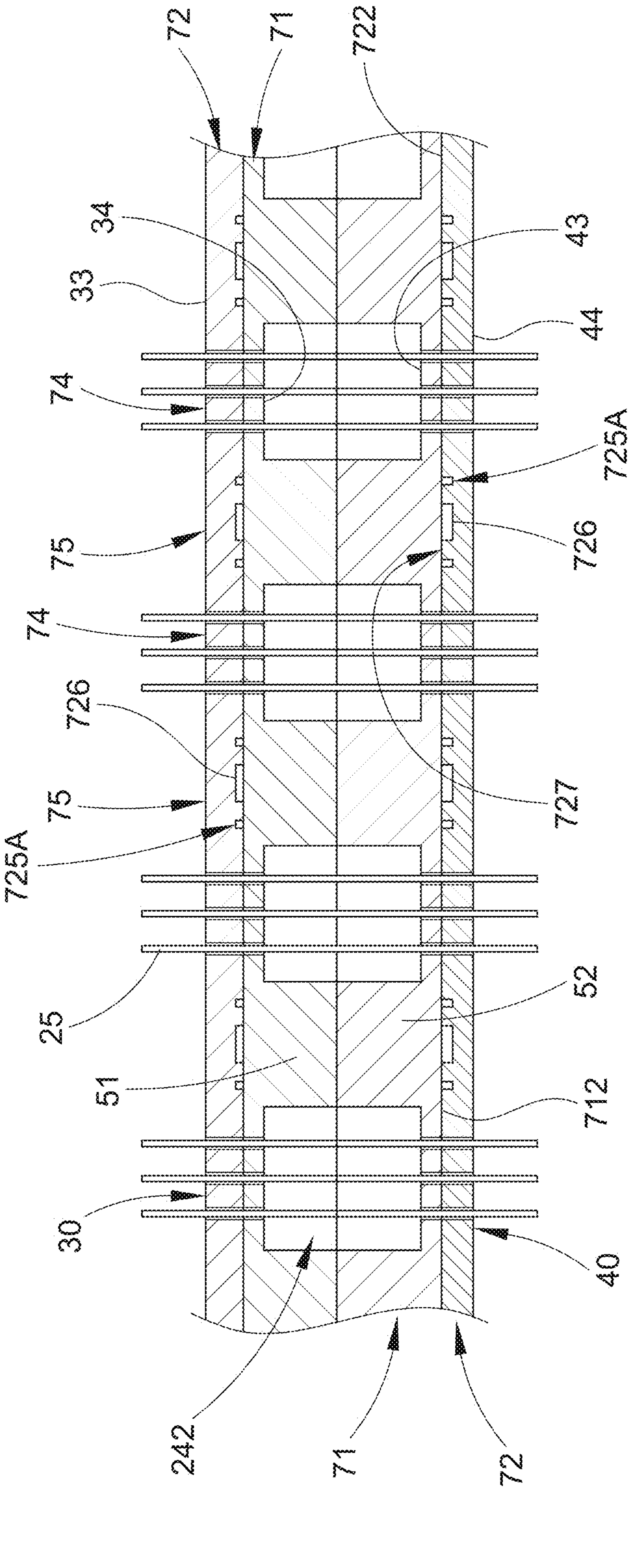
FIG. 16 is a partial sectional view of the probe seat shown in FIG. 15.
Figure 17:
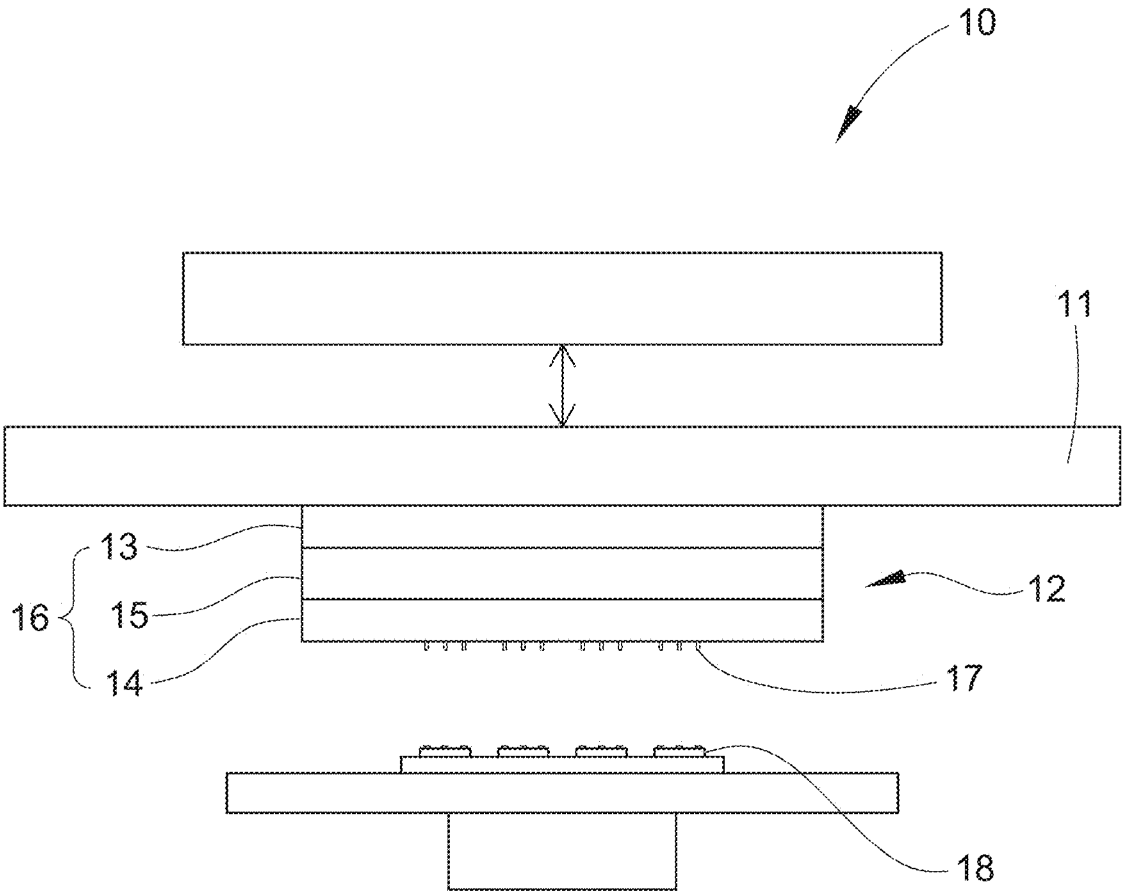
FIG. 17 PRIOR ART
FIG. 17 is a schematic view of a conventional test system.

The probe seat 24 shown in FIG. 1 includes an upper die unit 30, a lower die unit 40, and a middle die 241 disposed between the upper die unit 30 and the lower die unit 40. However, the probe seat 24 can have no middle die 241. The upper die unit 30 and the lower die unit 40 can be directly connected with each other (as shown in FIG. 15 and FIG. 16). In FIG. 1, the upper die unit 30 is composed of two dies 31, 32 piled on one another, and the lower die unit 40 is composed of two dies 41, 42 piled on one another. However, the present invention is unlimited to that the upper and lower die units 30, 40 both include a plurality of dies.

Figure 2:
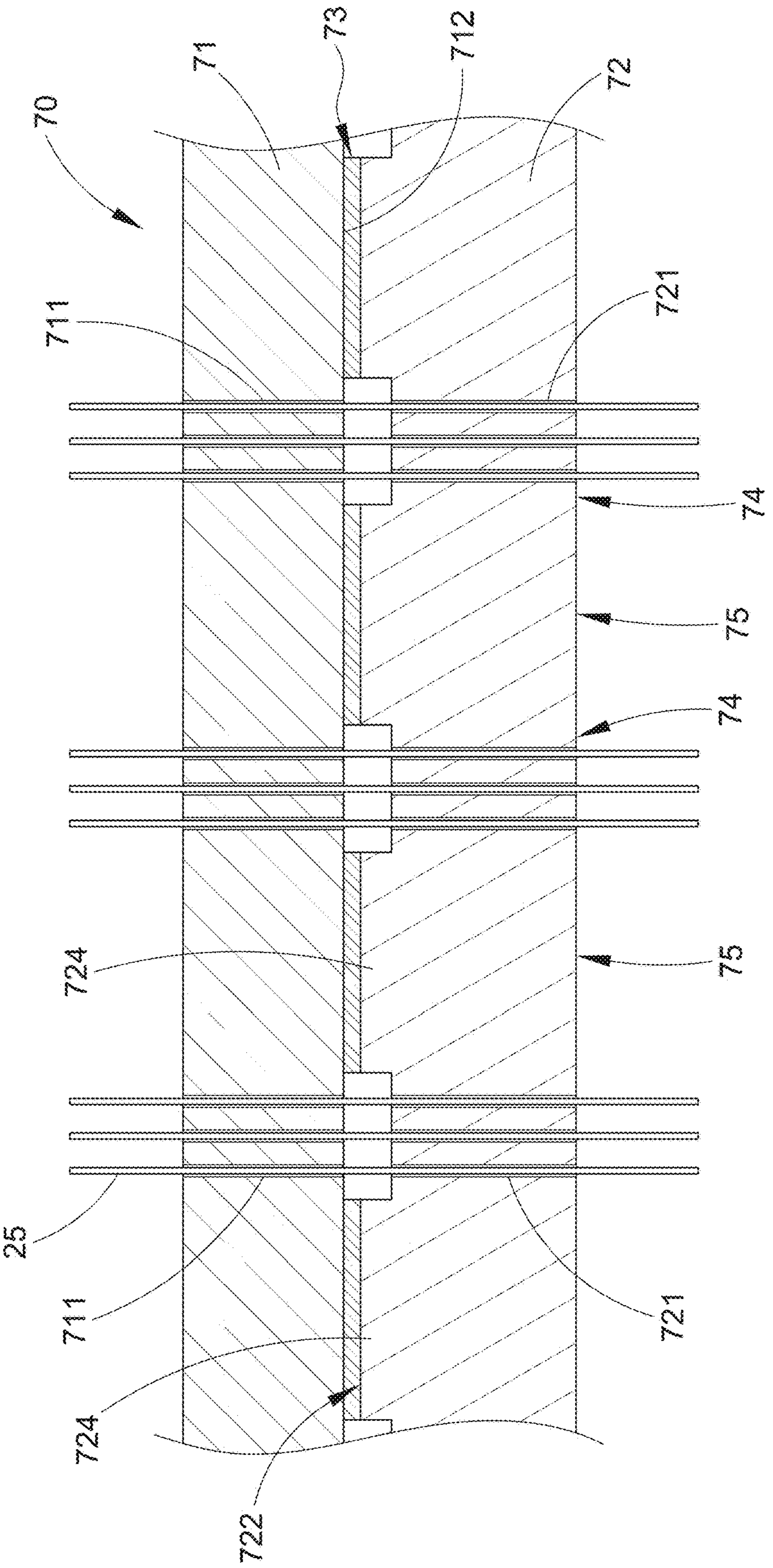
FIG. 2 is a schematic sectional view of an adhered multilayer die unit and a plurality of probes of a probe card of the test system.

In the probe seat 24 provided by the present invention, at least one of the upper and lower die units 30, 40 is an adhered multilayer die unit 70, as shown in FIG. 2. The adhered multilayer die unit provided by the present invention includes a plurality of dies. For example, the adhered multilayer die unit 70 shown in FIG. 2 includes two dies 71, 72. For example, in the case that the lower die unit 40 shown in FIG. 1 is the adhered multilayer die unit 70, the dies 41, 42 of the lower die unit 40 are the dies 71, 72 of the adhered multilayer die unit 70 respectively.

As shown in FIG. 2, the die 71 includes a plurality of through holes 711. The die 72 includes a plurality of through holes 721. The probes 25 are inserted through the through holes 711 of the die 71 respectively, and inserted through the through holes 721 of the die 72 respectively. The probes 25 are arranged correspondingly to the arrangement of the electrically conductive contacts 632 of the devices under test 63. According to the required probe arrangement, the adhered multilayer die unit 70 can be defined with at least one probe zone 74 and at least one non-probe zone 75. The through holes 711, 721 of the dies 71, 72 are located in the probe zone 74 for the probes 25 to be inserted in the probe zone 74. Where no probe 25 is required to be disposed is the non-probe zone 75. Therefore, there is no through hole 711, 721 in the non-probe zone 75.

In the adhered multilayer die unit provided by the present invention, each die includes at least one connecting surface. The connecting surface of the die refers to the surface adhered to another die by adhesive. In FIG. 2, the die 72 includes a first connecting surface 722, the die 71 includes a second connecting surface 712, and an adhesive layer 73 adheres the first connecting surface 722 and the second connecting surface 712 to each other. Besides, the adhesive layer 73 is entirely located in the non-probe zones 75. The section of the first and second connecting surfaces 722, 712 located in the non-probe zone 75 may be completely or partially covered by the adhesive layer 73.

Figure 3:
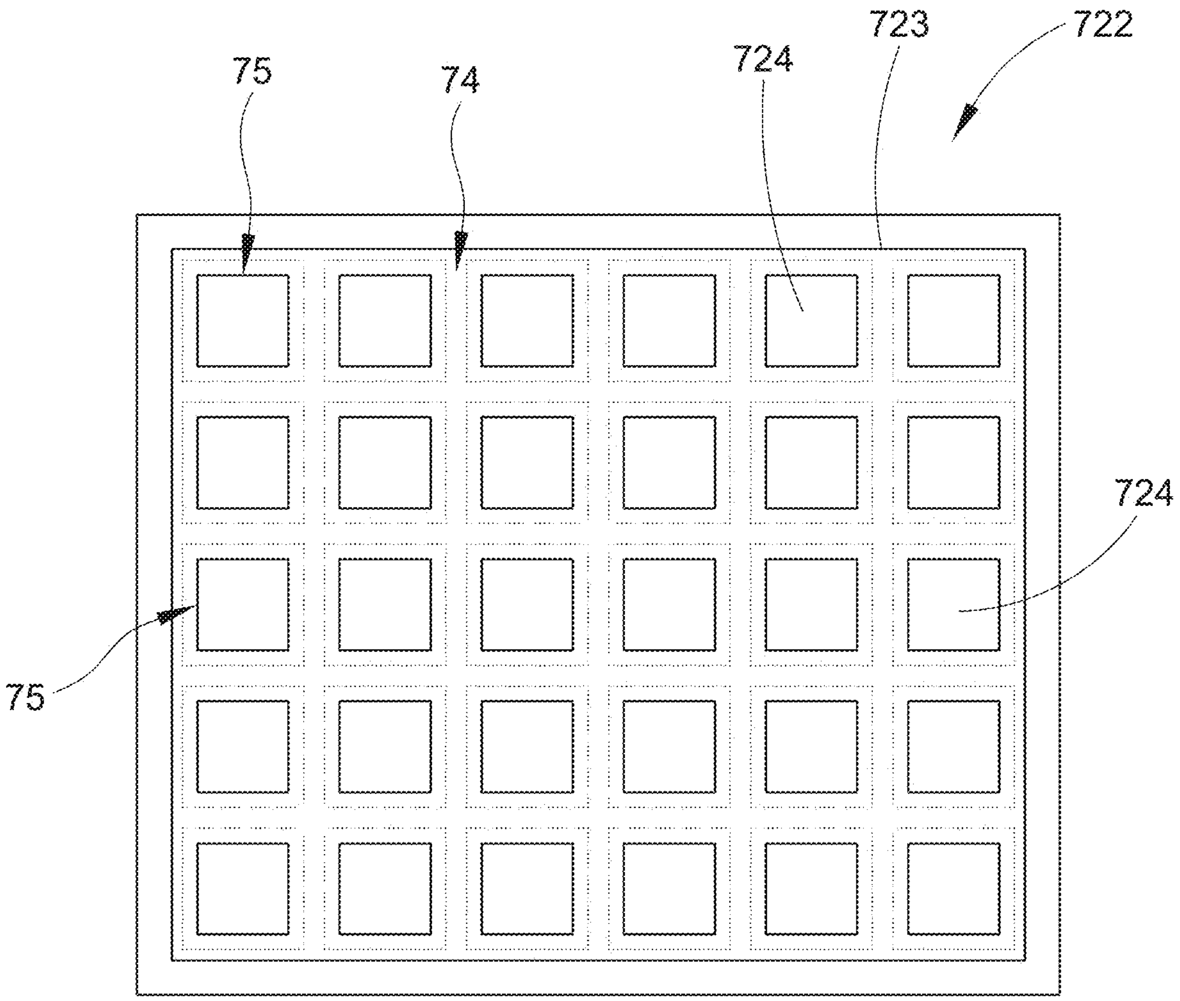
FIG. 3 is a schematic view of a die of the adhered multilayer die unit.

Further speaking, FIG. 3 shows the first connecting surface 722 of the die 72 shown in FIG. 2. For the simplification of the figure and the convenience of illustration, every non-probe zone 75 in FIG. 3 is surrounded by tiny points arranged in a loop to represent the through holes 721. As shown in FIG. 2 and FIG. 3, the second connecting surface 712 is a plane, and the first connecting surface 722 has recessed and protruding structure. More specifically speaking, the first connecting surface 722 includes a rectangular recess 723, and many rectangular protrusions 724 located in the recess 723. The locations of the protrusions 724 are the non-probe zones 75 respectively. Therefore, when the dies 71, 72 are adhered to each other, the protrusions 724 of the first connecting surface 722 are adhered to the second connecting surface 712 by the adhesive layer 73. In some embodiments, the adhesive layer 73 may adhere only the partial protrusions 724 to the second connecting surface 712.

It can be seen in FIG. 3 that the adhered multilayer die unit 70 in this embodiment includes many non-probe zones 75 arranged in a matrix. The probes 25 are arranged around these non-probe zones 75, which means the areas between adjacent non-probe zones 75 and on the periphery of all non-probe zones 75 are where the probes are inserted. These areas where the probes are inserted are connected with each other into a grid pattern without separation. Therefore, this kind of arrangement can be defined as including a plurality of non-probe zones 75 and a probe zone 74. The probe zone 74 is distributed in a grid pattern on the periphery of all the non-probe zones 75 and between the non-probe zones 75. The aforementioned through holes 711, 721 of the dies 71, 72 are all distributed in the probe zone 74 for the probes 25 to be inserted through the through holes 711, 721. In other words, the areas between the adjacent non-probe zones 75 and the area on the periphery of all the non-probe zones 75 are collectively regarded as a probe zone 74 shaped as a grid, and the non-probe zones 75 are regarded as meshes of the grid. The non-probe zones 75 in such arrangement enable the adhesive to be distributed relatively evener to attain great adhering effect.

As a result, the adhered multilayer die unit 70 in the present invention is a multilayer die unit composed of a plurality of dies 71, 72 adhered to each other by the adhesive layer 73. Therefore, during the manufacturing process of the adhered multilayer die unit 70, the dies 71, 72 can be drilled individually to be formed with the through holes 711, 721 in the probe zone 74, and then adhesive is applied in the non-probe zones 75 to be formed into the adhesive layer 73 so as to adhere the dies 71, 72 into the die unit, such that the problem of difficulty in the drilling process due to the increased thickness of a single die, which provides great structural strength, can be avoided and the size restriction of the fastening combining manner can be also avoided. Besides, the multiple layers of dies are piled on one another to attain a quite large thickness, making the adhered multilayer die unit 70 great in structural strength in the large-area condition. Besides, the adhered multilayer die unit 70 can be divided into the probe zone 74 and the non-probe zone 75. The non-probe zone 75 is not provided with any probe 25. The adhesive layer 73 is entirely located in the non-probe zone 75, which means the adhesive layer 73 is entirely located in the whole or partial section of the first and second connecting surfaces 722, 712 in the non-probe zone 75, such that adhesive spillage and its affection on the probes 25 can be avoided. In this way, even if the adhered multilayer die unit 70 has large area for being inserted with a large number of probes 25 corresponding to multiple devices under test 63, it can be ensured to have great die unit structural strength, and can also avoid the problem of difficulty in the drilling process and the size restriction of the fastening combining manner, and adhesive spillage and its affection on the probes 25 can be also avoided. As a result, the present invention can enhance the production efficiency and the product quality for the large-area probe card, especially the dies in the probe head thereof.

In addition, as shown in FIG. 2, the second connecting surface 712 is a plane. The first connecting surface 722 includes protrusions 724 located in the non-probe zones 75. Therefore, the first connecting surface 722 has protruding shape in the non-probe zone 75 with respect to the probe zone 74. As a result, the adhesive can be applied on the protrusions 724 before the protrusions 724 are connected with the second connecting surface 712. This manner can make the position for disposing the adhesive relatively more specific, further avoiding the adhesive spillage problem.

Figure 7:
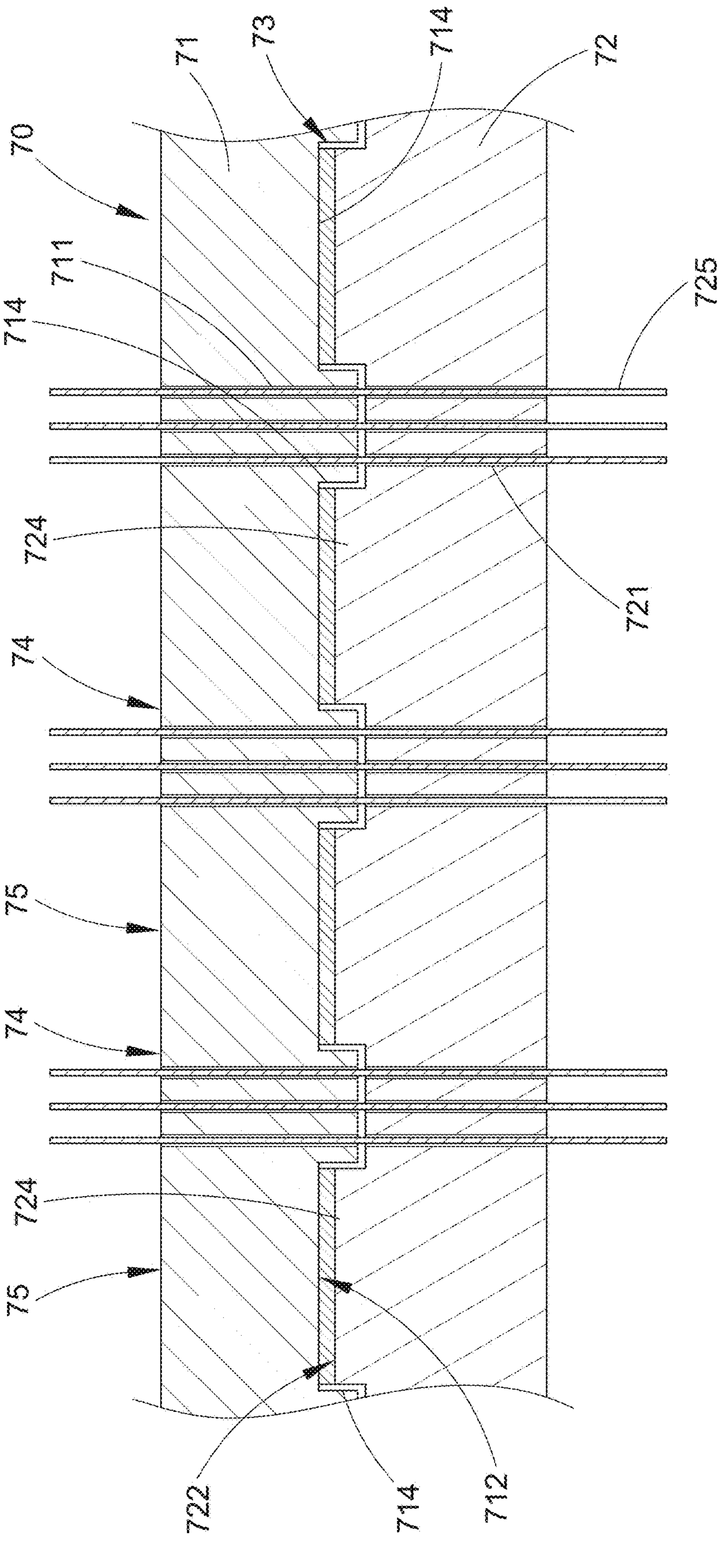
FIG. 7 is a schematic sectional view of an adhered multilayer die unit provided by a second preferred embodiment of the present invention and a plurality of probes.

Referring to FIG. 7, an adhered multilayer die unit 70 provided by a second preferred embodiment of the present invention is similar to that shown in FIG. 2. However, in FIG. 7, not only the first connecting surface 722 has recessed and protruding structure, but the second connecting surface 712 also has recessed and protruding structure. Specifically speaking, the first connecting surface 722 includes a plurality of protrusions 724 located in the non-probe zones 75 respectively. Therefore, the first connecting surface 722 has protruding shape in the non-probe zone 75 with respect to the probe zone 74. On the contrary, the second connecting surface 712 includes a plurality of recesses 714 located in the non-probe zones 75 respectively. Therefore, the second connecting surface 712 has recessed shape in the non-probe zone 75 with respect to the probe zone 74. In other words, the first connecting surface 722 has recessed shape in the probe zone 74 with respect to the non-probe zone 75, and the second connecting surface 712 has protruding shape in the probe zone 74 with respect to the non-probe zone 75. When the dies 71, 72 are adhered to each other, the protrusions 724 of the first connecting surface 722 are adhered in the recesses 714 of the second connecting surface 712 by the adhesive layer 73.

As a result, the adhesive can be applied on the protrusions 724, and then the protrusions 724 are connected with the recesses 714, so that the dies 71, 72 are adhered to each other. This manner can make the position for disposing the adhesive relatively more specific, further avoiding the adhesive spillage problem. Besides, when the first and second connecting surfaces 722, 712 are adhered, the adhesive is located in the recesses 714, further improbable to have the problem that the adhesive spills to the probe zone 74. Even if the adhesive spillage happens, the first and second connecting surfaces 722, 712 having their respective height difference between the probe zone 74 and the non-probe zone 75 can highly reduce the affection of the adhesive spillage on the probes 25 located in the probe zone 74. In addition, the first and second connecting surfaces 722, 712 having the embedding structure with the corresponding protrusions and recesses makes the alignment for assembly relatively easier.

For the adhered multilayer die unit provided by the present invention, the connecting surfaces of the dies are unlimited to have the aforementioned recessed and protruding structure. No matter there is the aforementioned recessed and protruding structure or not, at least one flow guiding groove and/or at least one adhesive dropping recess can be further provided to further avoid the adhesive spillage problem, which will be described in detail hereinafter.

Figure 4A:
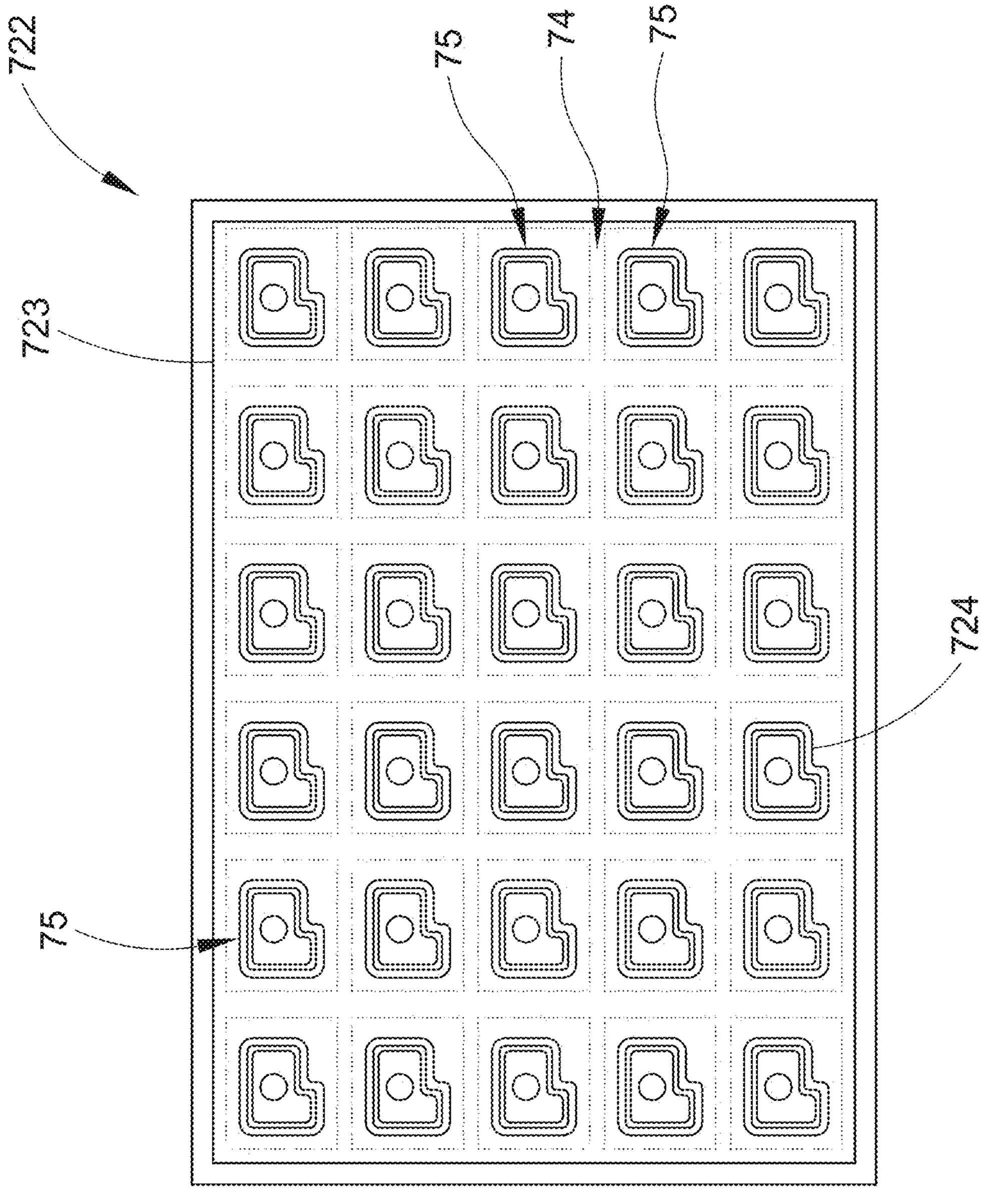
FIG. 4*a* is a schematic view of another configuration of the die.

The die 72 shown in FIG. 4*a* to FIG. 6 is similar to the die 72 shown in FIG. 2 and FIG. 3, but the primary difference therebetween includes not only the difference in shape of the protrusions 724 of the first connecting surface 722, but also that the first connecting surface 722 of the die 72 shown in FIG. 4*a* to FIG. 6 is further provided with a flow guiding groove 725A and an adhesive dropping recess 726 (unlimited to the circular shape) in each non-probe zone 75 (i.e. where the protrusion 724 is located). For the simplification of the figures and the convenience of illustration, every non-probe zone 75 in FIG. 4*a* and FIG. 4*b* is surrounded by tiny points arranged in a loop to represent the through holes 721. The flow guiding groove and the adhesive dropping recess mentioned in the present invention can be collectively provided on the first connecting surface 722 or the second connecting surface 712, or provided on different connecting surfaces respectively, or each partially provided on both the first and second connecting surfaces 722, 712. For the simplification of the figures and the convenience of illustration, the flow guiding groove 725A and the adhesive dropping recess 726 being collectively provided on the first connecting surface 722 is instanced in FIG. 4*a* to FIG. 6.

Figure 4B:
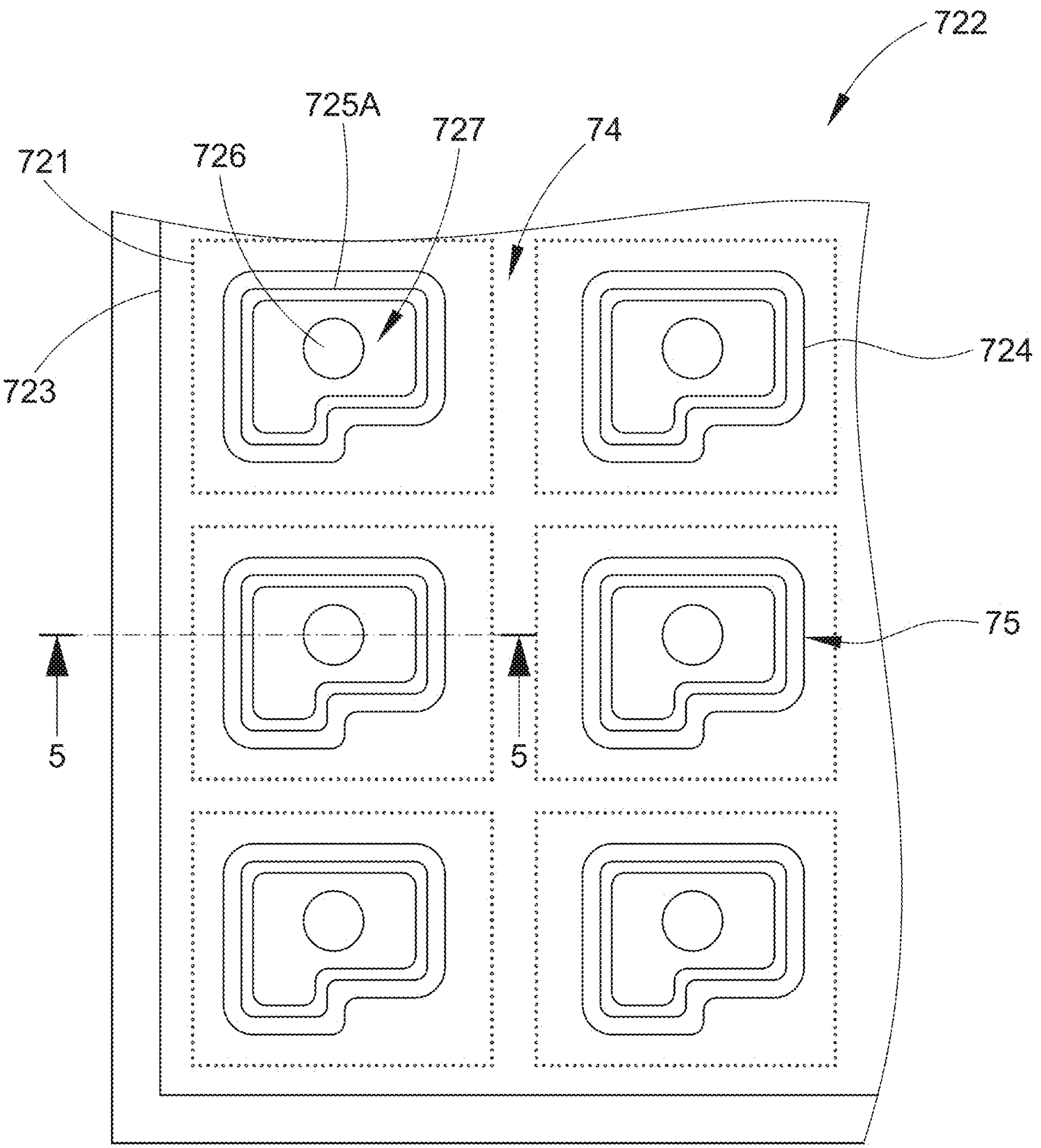
FIG. 4*b* is a partially enlarged view of FIG. 4*a*.

As shown in FIG. 4*b*, the flow guiding groove 725A forms a closed loop, and is also called closed flow guiding groove, the area surrounded by which is defined as an adhesive applying region 727. Therefore, the flow guiding groove 725A is located between the adhesive applying region 727 and the probe zone 74. The adhesive dropping recess 726 is located in the adhesive applying region 727.

Figure 5:
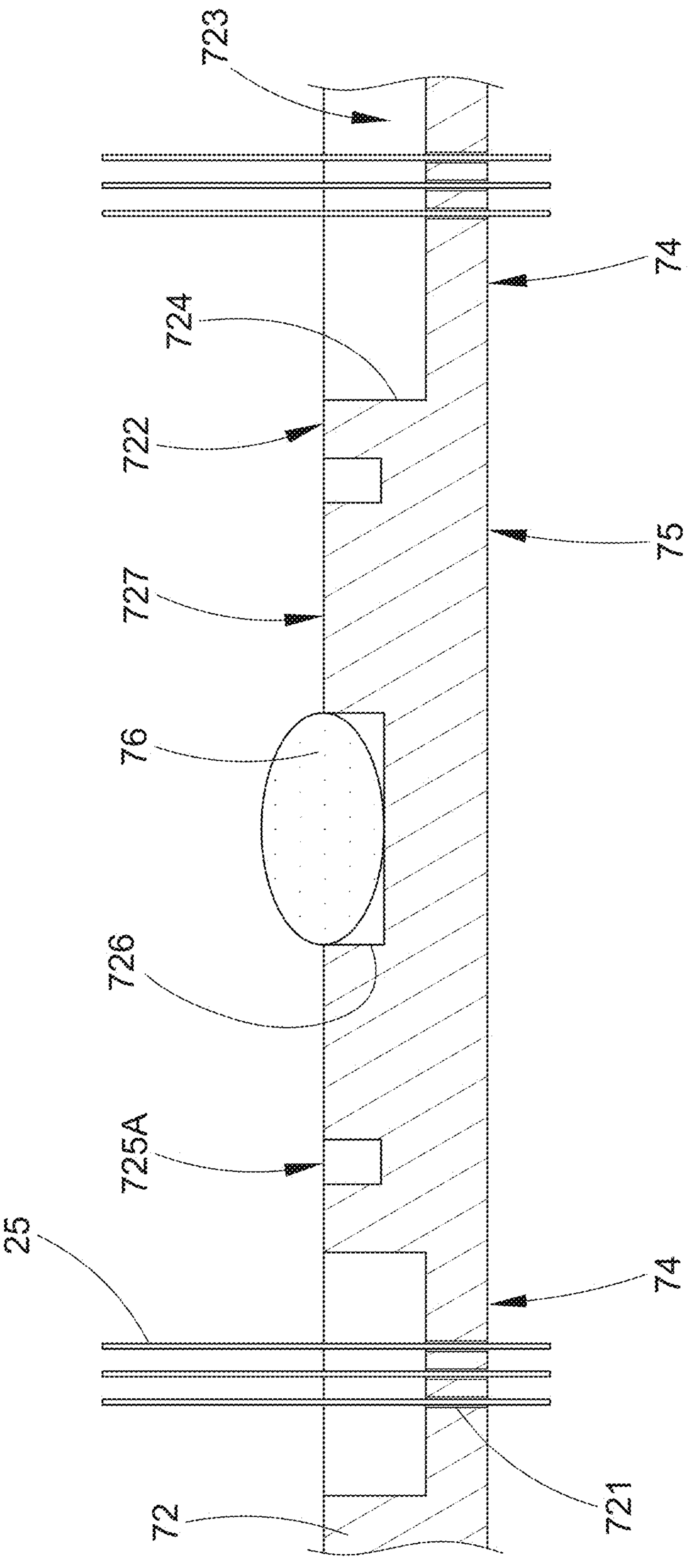
FIG. 5 is a sectional view taken along the line 5-5 in FIG. 4*b*, further showing adhesive and a plurality of probes.
Figure 6:
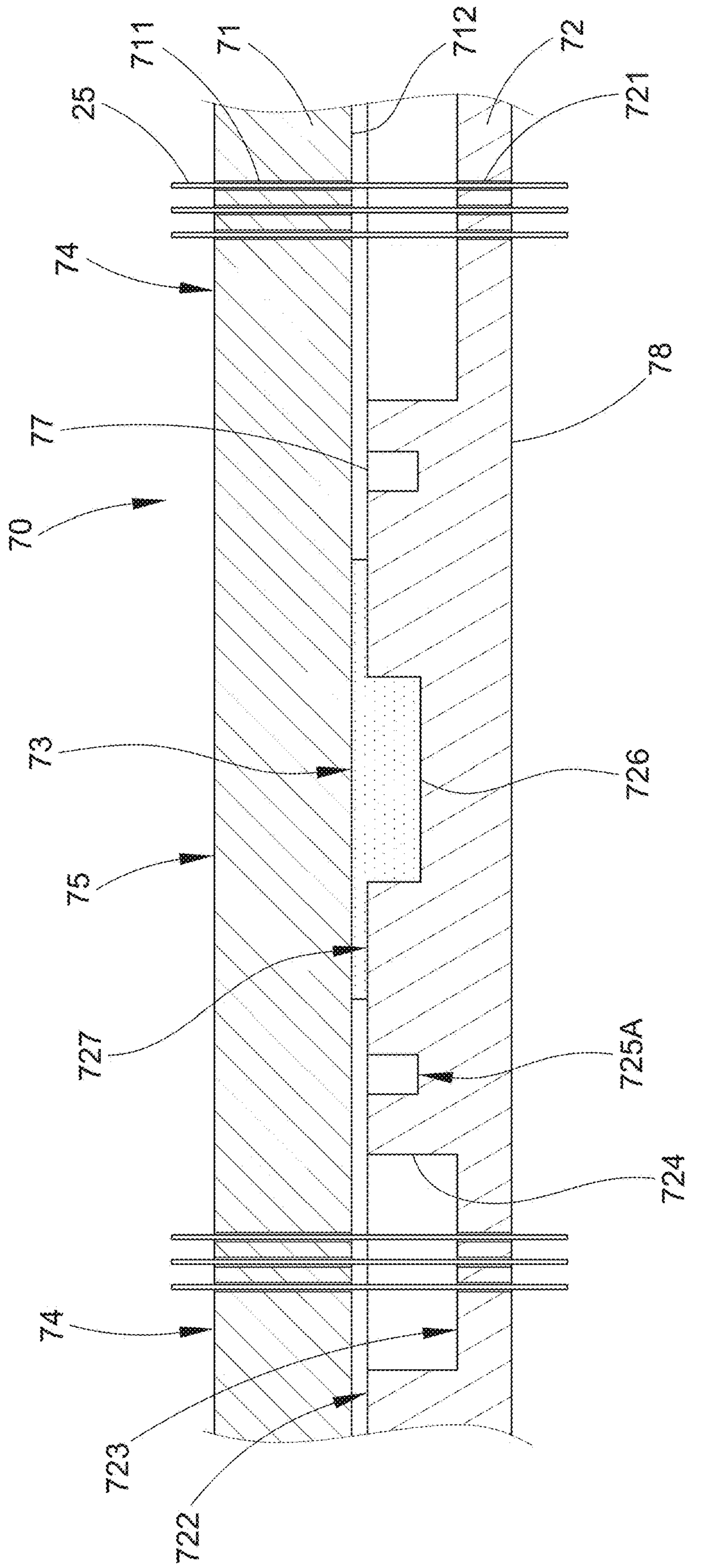
FIG. 6 is a schematic sectional view of the adhered multilayer die unit which has the die shown in FIG. 5, and a plurality of probes.

As a result, as shown in FIG. 5, the adhesive 76 can be firstly dropped in the adhesive dropping recess 726, and then smeared to other parts of the adhesive applying region 727, or not smeared but spread to other parts of the adhesive applying region 727 when the die 71 is pressed on the die 72 for combination (as shown in FIG. 6). By the adhesive 76 being dropped in the adhesive dropping recess 726, the thickness of the adhesive layer 73 formed at last can be controlled easily, so as to avoid the levelness deviation of the dies. Besides, the adhesive dropping recess 726 provides a specific and easily recognizable position for dropping the adhesive, which can make the adhesive dropping process performed relatively more precisely. In addition, the adhesive 76 will be partially congregated in the adhesive dropping recess 726, so that the connecting surfaces of the dies don't need large-area adhesive distribution and can be still effectively adhered and fixed.

Furthermore, even if the adhesive 76 goes beyond the adhesive applying region 727 when being smeared or when the dies 71, 72 are pressed for combination, the adhesive 76 will flow into the flow guiding groove 725A, such that the adhesive 76 can be prevented from further spreading, thereby further ensuring that the adhesive will not spill to the probe zone 74 to affect the probes 25. In particular, the flow guiding groove 725A is a closed flow guiding groove, which can generate great adhesive stopping effect, thereby great in adhesive spillage avoiding effect.

The non-probe zone 75 may be provided with only the adhesive dropping recess 726 but no flow guiding groove 725A, which can still attain the adhesive spillage avoiding effect. Alternatively, the non-probe zone 75 may be provided with only the flow guiding groove 725A but no adhesive dropping recess 726, which can still specifically provide the adhesive applying region 727 to make the position for disposing the adhesive relatively more specific, further avoiding the adhesive spillage problem. Besides, the flow guiding groove 725A can generate great adhesive stopping effect, thereby further ensuring that the adhesive will not spill to the probe zone 74 to affect the probes 25.

It can be known from the above description that the adhered multilayer die unit provided by the present invention is suitable to be applied to the large-area probe card for being disposed with a large number of probes for testing multiple devices under test at the same time, making the probe card great in both structural strength and testing efficiency. In particular, for matching the current testing manner for multiple devices under test, the adhered multilayer die unit of the present invention may adopt the peripheral type probe arrangement as shown in FIG. 3 and FIG. 4*a*, or the concentrated type probe arrangement as shown in FIG. 8, or the skipping DUT type probe arrangement as shown in FIG. 9, which will be specified hereinafter.

Figure 8:
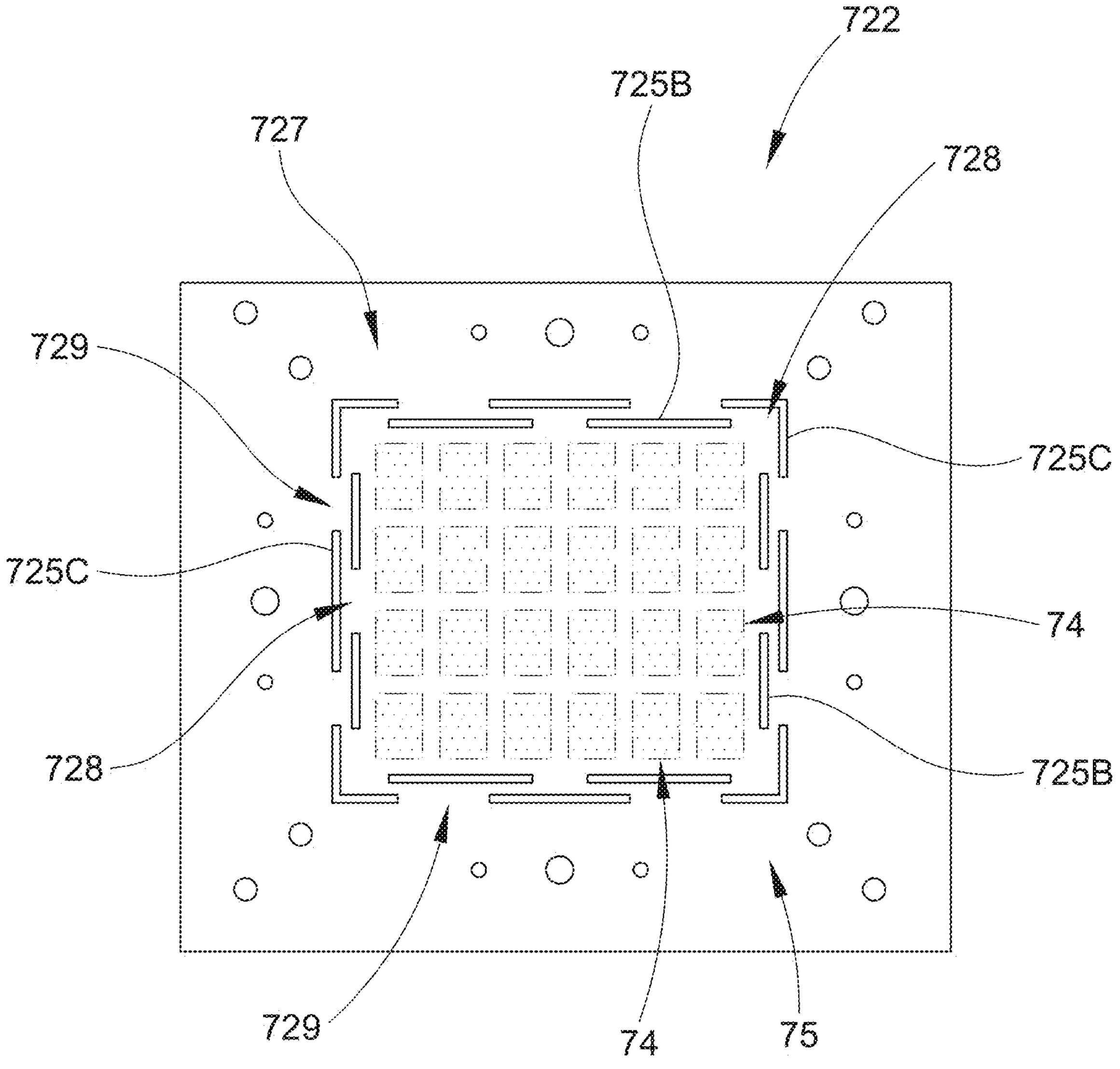
FIG. 8 and FIG. 9 are schematic views of two other configurations of the die.

Similarly, in FIG. 8, the probe zones 74 and non-probe zone 75 of the adhered multilayer die unit are schematically shown on the first connecting surface 722 of the die 72. This kind of adhered multilayer die unit includes a plurality of probe zones 74 arranged in a matrix, and a non-probe zone 75 located on the periphery of all the probe zones 74. The aforementioned through holes 711, 721 of the dies 71, 72 are all distributed in the probe zones 74 for the probes 25 to be inserted through the through holes 711, 721. For the simplification of the figure and the convenience of illustration, the through holes 721 are represented by tiny points in FIG. 8. In this kind of adhered multilayer die unit, the probe zones 74 are centralized to be arranged in the central region of the die unit. The peripheral region of the die unit serves as the non-probe zone 75, such that the probe zones 74 and the non-probe zone 75 are separated quite clearly, making the adhesive disposed in the non-probe zone 75 improbable to affect the probes, and the non-probe zone 75 has large area for the adhesive to be distributed in large area to attain great adhering effect.

Similarly, the first connecting surface 722 of the die 72 shown in FIG. 8 can (but unlimited to) be provided with a flow guiding groove and an adhesive dropping recess in the non-probe zone 75 to avoid the adhesive spillage problem. In FIG. 8, another type of flow guiding groove different from the aforementioned closed flow guiding groove is instanced for illustration. The first connecting surface 722 shown in FIG. 8 has a plurality of flow guiding grooves, including a plurality of inner flow guiding grooves 725B and a plurality of outer flow guiding grooves 725C. The inner flow guiding grooves 725B form a disconnected loop surrounding all the probe zones 74. The outer flow guiding grooves 725C also form a disconnected loop which surround all the inner flow guiding grooves 725B. This kind of flow guiding grooves forming a disconnected loop are also called disconnected flow guiding grooves in the present invention. Every two adjacent inner flow guiding grooves 725B have a gap 728 therebetween. The outer flow guiding grooves 725C are located correspondingly to the gaps 728 respectively. In FIG. 8, the adhesive applying region 727 defined by the flow guiding grooves surrounds all the outer flow guiding grooves 725C. The inner and outer flow guiding grooves 725B, 725C are all located between the adhesive applying region 727 and the probe zones 74. Before two dies are adhered to each other, the adhesive is disposed in the adhesive applying region 727. When the two dies are pressed to be combined with each other, the adhesive layer is formed in the adhesive applying region 727 and adheres the two dies to each other firmly. The adhesive applying region 727 can be also provided therein with the adhesive dropping recess (not shown) to make the adhesive dropping position relatively more precise and improve the adhering effect.

Figure 9:
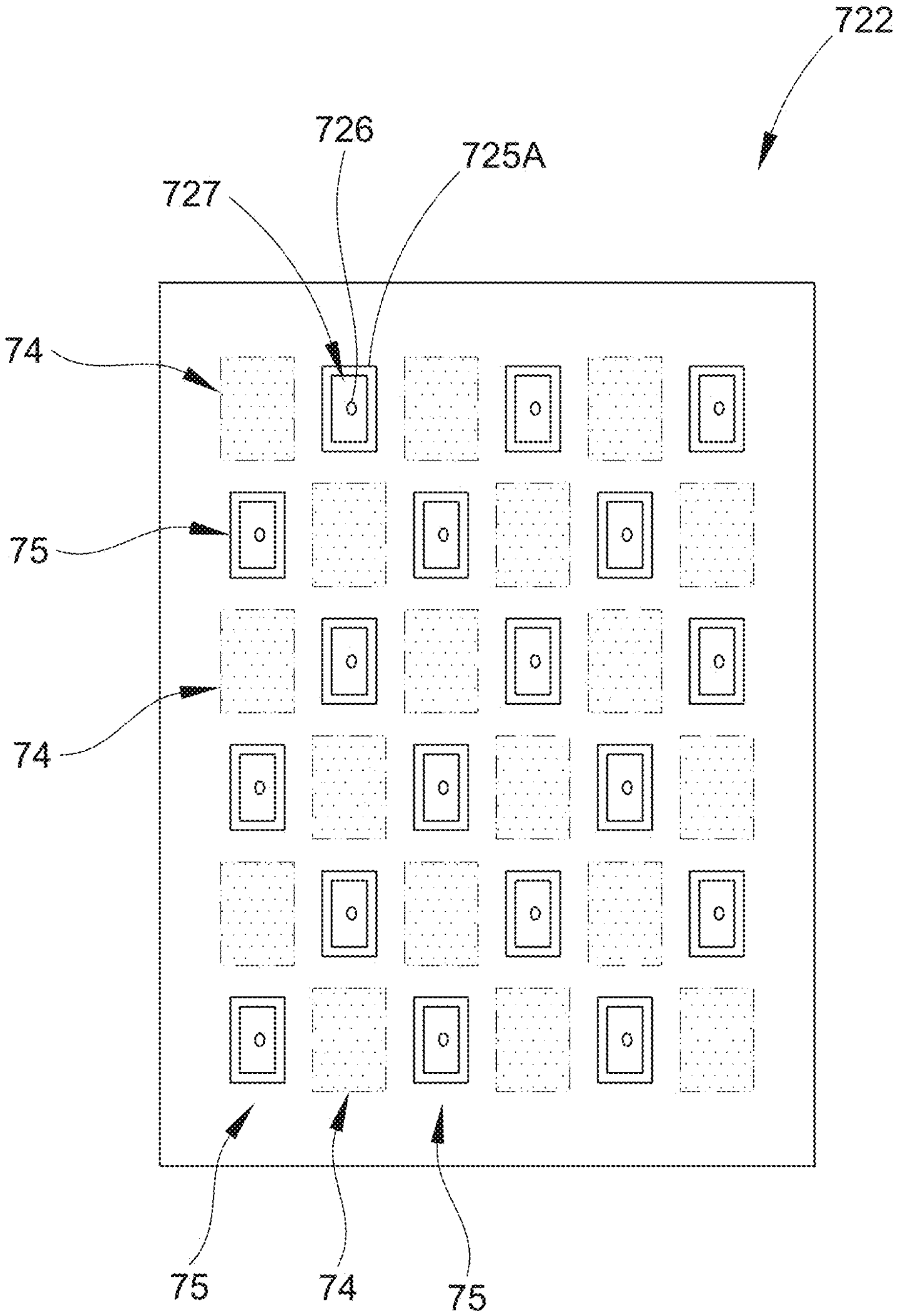

Similarly, in FIG. 9, the probe zones 74 and non-probe zones 75 of the adhered multilayer die unit are schematically shown on the first connecting surface 722 of the die 72. This kind of adhered multilayer die unit includes a plurality of probe zones 74 and a plurality of non-probe zones 75, which are distributed in a staggered manner. The probe zones 74 and the non-probe zones 75 are collectively arranged in a matrix. Being distributed in a staggered manner means that the probe zones 74 are all adjacent to the non-probe zones 75, but not adjacent to any probe zone 74; the non-probe zones 75 are also all adjacent to the probe zones 74, but not adjacent to any non-probe zone 75. The aforementioned through holes 711, 721 of the dies 71, 72 are all distributed in the probe zones 74 for the probes 25 to be inserted through the through holes 711, 721. For the simplification of the figure and the convenience of illustration, the through holes 721 are represented by tiny points in FIG. 9. The through hole distribution in each probe zone 74 is unlimited to the dense distribution as shown in FIG. 9, but can be any required arrangement. This kind of adhered multilayer die unit is adapted for the testing manner of testing the non-adjacent devices under test at the same time (usually called skipping DUT). That means, when the test is performed, all the probe zones 74 and non-probe zones 75 are each located correspondingly to a device under test, but only the probe zones 74 have the probes. Therefore, the devices under test located correspondingly to the non-probe zones 75 are not tested. In the next time of test, the probe card only needs to be moved for a small distance to make the probe zones 74 moved to the positions of the non-probe zones 75 in the last time of test, so as to test the devices under test not tested in the last time of test. Because there is a non-probe zone 75 with quite large area between every two probe zones 74 for disposing the adhesive, great adhering effect can be attained.

Similarly, the first connecting surface 722 shown in FIG. 9 can (but unlimited to) have a flow guiding groove and an adhesive dropping recess in each non-probe zone 75 to avoid the adhesive spillage problem. The flow guiding grooves 725A shown in FIG. 9 are closed flow guiding grooves, but unlimited thereto. Each flow guiding groove 725A defines an adhesive applying region 727 surrounded thereby. The flow guiding groove 725A is located between the adhesive applying region 727 and the probe zone 74. Each adhesive applying region 727 is provided therein with an adhesive dropping recess 726. The adhesive can be dropped in each adhesive dropping recess 726. When two dies are pressed to be combined with each other, the adhesive layer will be formed in the adhesive applying regions 727 and adhere the two dies to each other firmly.

Figure 10A:
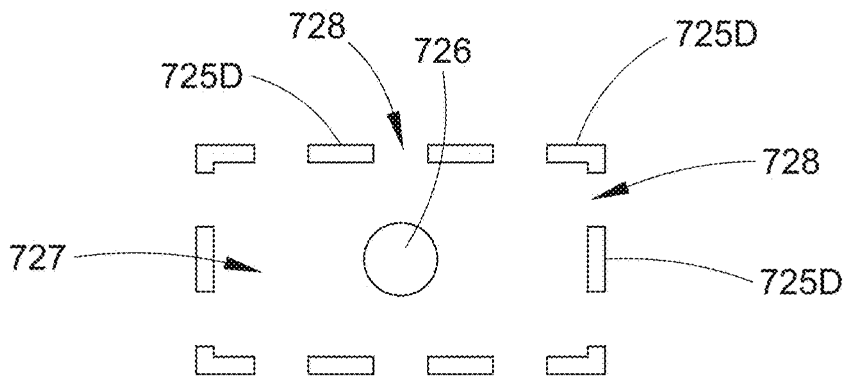
FIG. 10*a*, FIG. 10*b* and FIG. 11 are schematic views of three configurations of flow guiding groove and adhesive dropping recess arrangement.
Figure 10B:
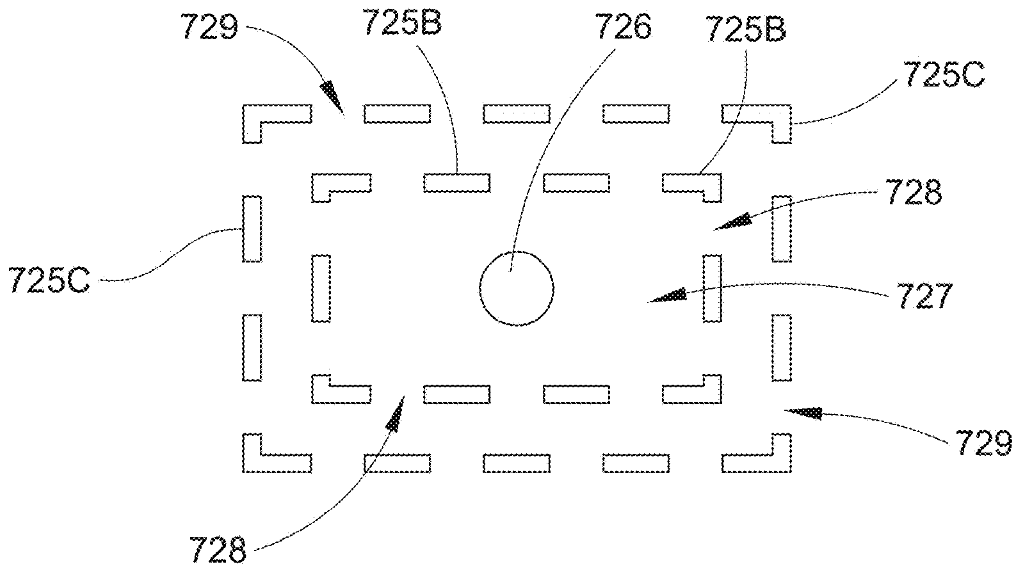
Figure 11:
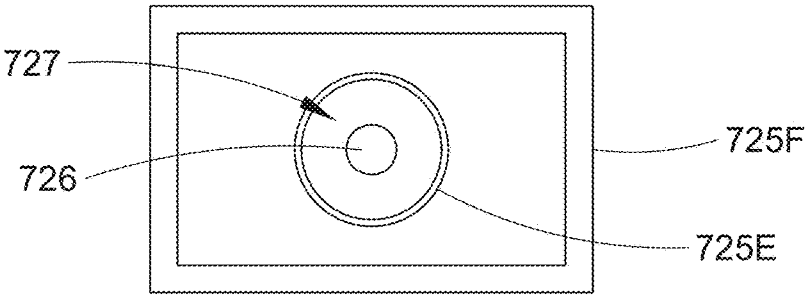

The arrangement of the flow guiding groove in the present invention can be varied according to requirements, as long as the flow guiding groove can form at least one closed or disconnected loop to define the adhesive applying region. The adhesive applying region can be the area surrounded by the flow guiding groove or on the periphery of the flow guiding groove, as long as the flow guiding groove is located between the adhesive applying region and the probe zone. FIG. 10*a*, FIG. 10*b* and FIG. 11 illustrate three other arrangements of flow guiding grooves, wherein the adhesive applying region 727 is located in the area surrounded by the flow guiding grooves and provided with an adhesive dropping recess 726. However, the adhesive applying region 727 can be located on the periphery of the flow guiding grooves, and the adhesive applying region 727 is unlimited to be provided with the adhesive dropping recess 726.

The flow guiding grooves shown in FIG. 10*a* include a plurality of disconnected flow guiding grooves 725D. The disconnected flow guiding grooves 725D form a disconnected loop. As a result, the adhesive can still flow through the gaps 728 between the disconnected flow guiding grooves 725D, which can slightly broaden the distribution area of the adhesive to generate great adhering effect. Meanwhile, the disconnected flow guiding grooves 725D can still effectively stop the adhesive to attain the adhesive spillage avoiding effect. That means, such arrangement of disconnected flow guiding grooves 725D can be used to control the adhesive quantity, so as to lower the required precision of controlling the quantity of the applied adhesive, raising ease of manufacturing.

The flow guiding grooves shown in FIG. 10*b* are similar to those shown in FIG. 8, including a plurality of inner flow guiding grooves 725B and a plurality of outer flow guiding grooves 725C. The inner and outer flow guiding grooves 725B, 725C are all disconnected flow guiding grooves. The inner flow guiding grooves 725B form a disconnected loop. The outer flow guiding grooves 725C also form a disconnected loop and surround all the inner flow guiding grooves 725B. Every two adjacent inner flow guiding grooves 725B have a gap 728 therebetween. The outer flow guiding grooves 725C are located correspondingly to the gaps 728 respectively.

As a result, in the configurations shown in FIG. 8 and FIG. 10*b*, the inner and outer flow guiding grooves 725B, 725C form a complementary effect. In the case that the adhesive is applied in the area surrounded by the inner flow guiding grooves 725B, such as shown in FIG. 10*b* that the adhesive applying region 727 is located in the area surrounded by the inner flow guiding grooves 725B, the adhesive can still flow through the gaps 728 between the inner flow guiding grooves 725B, which can slightly broaden the distribution area of the adhesive to generate great adhering effect. Meanwhile, the outer flow guiding grooves 725C, because of being located correspondingly to the gaps 728 between the inner flow guiding grooves 725B, can effectively stop the adhesive from overly spreading outward. Similarly, in the case that the adhesive is applied outside the area surrounded by the outer flow guiding grooves 725C, such as shown in FIG. 8 that the adhesive applying region 727 is located outside the area surrounded by the outer flow guiding grooves 725C, the adhesive can still flow inward through the gaps 729 between the outer flow guiding grooves 725C, and then the adhesive is stopped by the inner flow guiding grooves 725B from overly spreading inward. It can be known from this that such configuration of the inner and outer flow guiding grooves 725B, 725C being complementary to each other can attain great adhering effect, and can effectively avoid the adhesive spillage problem. That means, such configuration of the inner and outer flow guiding grooves 725B, 725C being complementary to each other can be used to control the adhesive quantity, so as to lower the required precision of controlling the quantity of the applied adhesive, raising ease of manufacturing.

The flow guiding grooves shown in FIG. 11 include an inner flow guiding groove 725E and an outer flow guiding groove 725F. The inner flow guiding groove 725E and the outer flow guiding groove 725F are each a closed flow guiding groove. The inner flow guiding groove 725E forms a closed loop. The outer flow guiding groove 725F also forms a closed loop and surrounds the inner flow guiding groove 725E. As a result, the closed flow guiding groove has a great effect of avoiding adhesive spillage, and two loops of flow guiding groove can generate greater adhesive stopping effect than a single loop of flow guiding groove. Alternatively, at least one of the inner and outer flow guiding grooves 725E, 725F can be changed into disconnected flow guiding grooves, which can be arranged according to requirements.

Figure 12:
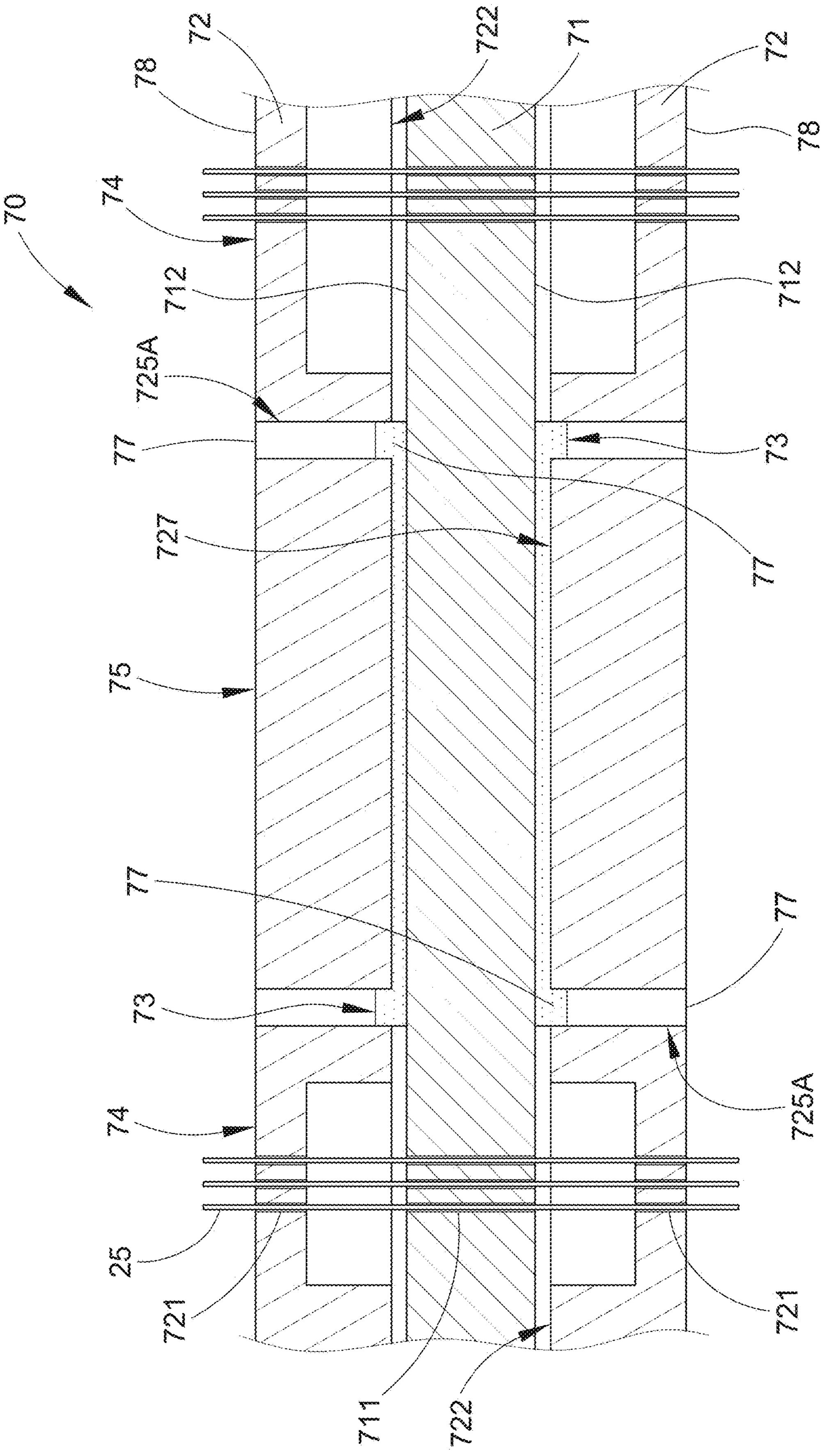
FIG. 12 is a schematic sectional view of an adhered multilayer die unit provided by a third preferred embodiment of the present invention and a plurality of probes.

In the present invention, a plurality of dies are adhered to each other by the adhesive layer, so as to compose the adhered multilayer die unit, wherein three or more dies may be included. For example, an adhered multilayer die unit 70 provided by a third preferred embodiment of the present invention shown in FIG. 12 includes a die 71 and two dies 72. The die 71 is disposed between the two dies 72. Therefore, the die 71 is also called inner layer die, and the dies 72 are also called outer layer dies.

The dies 71, 72 in this embodiment are similar to the dies 71, 72 described in the second preferred embodiment (as shown in FIG. 6), but the first connecting surface 722 of the die 72 in this embodiment has no adhesive dropping recess, and the die 71 needs to be adhered to two dies 72, thereby including two second connecting surfaces 712 facing toward opposite directions. The first connecting surfaces 722 of the dies 72 are adhered to the second connecting surfaces 712 of the die 71 respectively, so there are two adhesive layers 73. The structural features and effects of this embodiment, except for those going to be described in the next paragraph, are all similar to the second preferred embodiment, thereby not repeatedly described hereinafter.

Except for the above-described differences, the flow guiding groove 725A shown in FIG. 6 is recessed from its situated first connecting surface 722, so the flow guiding groove 725A has only one opening 77 located on the first connecting surface 722, but no opening on another surface 78 opposite to the first connecting surface 722. Therefore, the adhesive can be prevented from flowing to the surface 78. However, the flow guiding groove 725A shown in FIG. 12 penetrates through the die 72, so the flow guiding groove 725A has two openings 77 located on the first connecting surface 722 and the surface 78 respectively. As a result, the adhesive can be applied on the second connecting surfaces 712 of the die 71, and then the first connecting surfaces 722 of the dies 72 are adhered to the second connecting surfaces 712 of the die 71 respectively, such that the positions of the flow guiding grooves 725A can be recognized from the surfaces 78 of the dies 72 (i.e. the outer surfaces of the die unit), attaining great alignment effect.

It is to be mentioned that in the case that the flow guiding groove is not located on the outer surface of the die unit or is covered by other components of the probe card, although the flow guiding groove cannot be seen on the appearance of the probe card, the flow guiding groove in the die unit can be recognized in the image taken under X-ray.

In each above-described embodiment, the widths of all the through holes 711, 721 of the dies 71, 72 are only a little larger than the width of the probes 25 for controlling the moving action of the probes 25. However, in the condition that the die unit includes three or more dies, at least one of the dies can have relatively wider through holes to make the through holes of different dies relatively easier to be aligned with each other.

Figure 13:
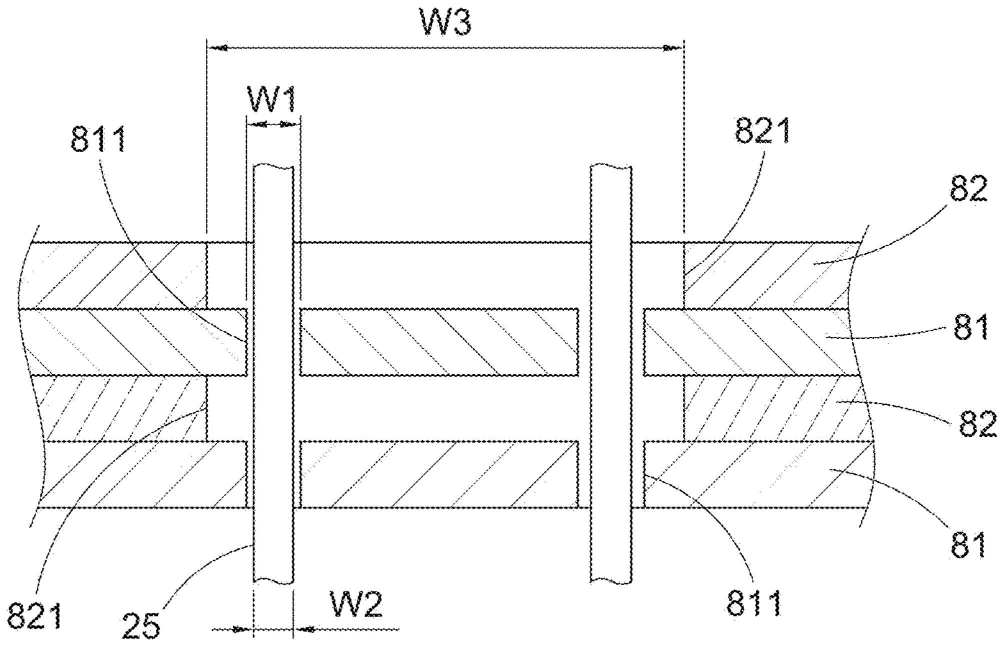
FIG. 13 and FIG. 14 are schematic sectional views of two other configurations of the adhered multilayer die unit and a plurality of probes.
Figure 14:
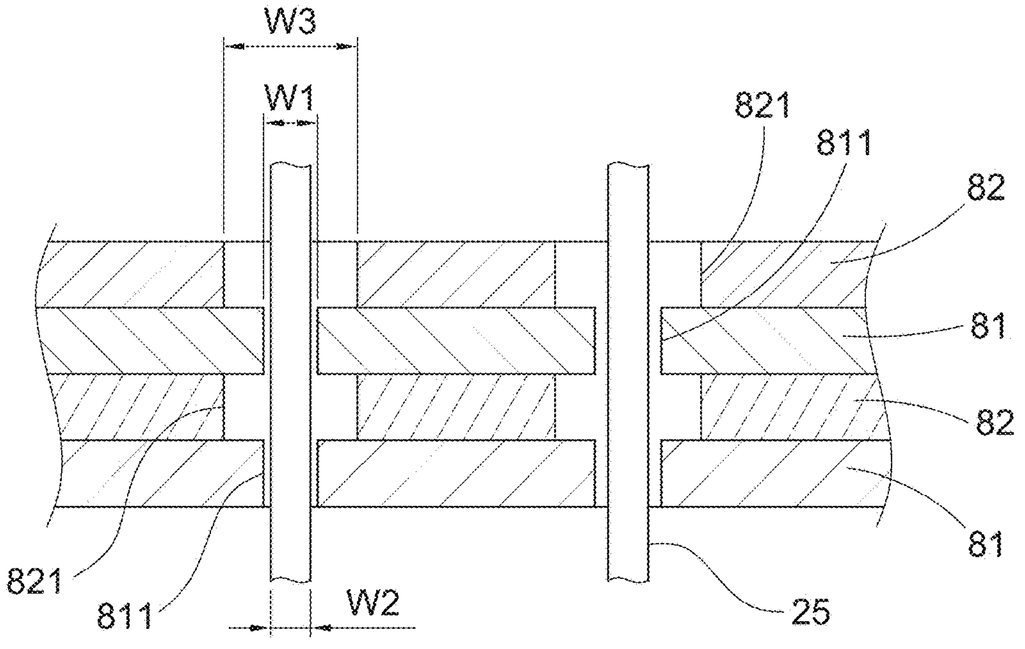

For example, the die units shown in FIG. 13 and FIG. 14 both include four dies, including two positionally limiting dies 81 and two alignment dies 82. The positionally limiting dies 81 and the alignment dies 82 are piled on one another in a staggered manner, which means the positionally limiting dies 81 are both piled with the alignment dies 82 but piled with no positionally limiting die 81, and the alignment dies 82 are both piled with the positionally limiting dies 81 but piled with no alignment die 82. The width W1 of the through holes 811 of the positionally limiting dies 81 is provided in coordination with the width W2 of the probes 25 for controlling the moving action of the probes 25. The width W3 of the through holes 821 of the alignment dies 82 is larger than the width W1 of the through holes 811 of the positionally limiting dies 81, which is beneficial for the through holes 811, 821 of different dies to be aligned with each other, so as to avoid that there is a through hole aligned inaccurately, thereby making the action of the probe 25 affected by the burr of the through hole. In FIG. 13, one through hole 821 directly communicates with two through holes 811. The width W3 of such through holes 821 is relatively larger, further beneficial for alignment. By comparison, the width W3 of the through holes 821 in FIG. 14 is relatively smaller. One through hole 821 directly communicates with only one through hole 811, which can bring the alignment die 82 relatively higher structural strength and is still beneficial to the alignment of the through holes 811, 821. For the convenience of illustrating the above technical features, only the positionally limiting dies 81 and alignment dies 82, the through holes 811, 821 thereof and the probes 25 are schematically shown in FIG. 13 and FIG. 14. Other structural features of the positionally limiting dies 81 and the alignment dies 82 are similar to those of the above-described dies 71, 72, thereby not repeatedly described hereinafter and not shown in FIG. 13 and FIG. 14.

Referring to FIG. 15 and FIG. 16, a fourth preferred embodiment of the present invention provides a probe seat 24, the upper and lower die units 30, 40 of which are both the above-described adhered multilayer die units 70, and a supporting structure 50 is further disposed between the upper and lower die units 30, 40 for improving the structural strength of the probe seat 24, so that the upper and lower die units 30, 40 are uneasy to be deformed by the received force.

Each of the upper and lower die units 30, 40 includes two dies 71, 72 adhered to each other, which are similar to the dies 71, 72 shown in FIG. 6. However, in this embodiment, the die 71 of the upper die unit 30 has an upper recess 37, the die 71 of the lower die unit 40 has a lower recess 47, and the upper and lower die units 30, 40 are connected with each other so that an accommodating space 242 is formed by the combination of the upper recess 37 and the lower recess 47. The upper and lower die units 30, 40 can be collectively defined with probe zones 74 and non-probe zones 75, and the non-probe zones 75 are provided with flow guiding grooves 725A and adhesive dropping recesses 726. The dies 71, 72 are adhered to each other by the adhesive layer disposed in the non-probe zones 75. The adhesive layer is very thin in practice, thereby not shown in FIG. 15 and FIG. 16.

The upper die unit 30 includes an upper surface 33, a lower surface 34, and a plurality of upper through holes penetrating through the upper surface 33 and the lower surface 34. Each upper through hole includes a through hole 711 and a through hole 721 as shown in FIG. 6. The lower die unit 40 includes an upper surface 43, a lower surface 44, and a plurality of lower through holes penetrating through the upper surface 43 and the lower surface 44. Each lower through hole includes a through hole 711 and a through hole 721 as shown in FIG. 6. The through holes 711, 721 of the dies 71, 72 are practically tiny in radius and large in amount. For the simplification of the figures and the convenience of illustration, the through holes 711, 721 are not shown in FIG. 15 and FIG. 16.

The supporting structure 50 includes a plurality of supporting pillars. The plurality of supporting pillars include a plurality of upper supporting pillars 51 and a plurality of lower supporting pillars 52. The plurality of supporting pillars are disposed between the upper die unit 30 and the lower die unit 40. In the present invention, the lower surface 34 of the upper die unit 30 and the upper surface 43 of the lower die unit 40 refer to the surfaces which the supporting pillars are located on. The upper supporting pillars 51 integrally extend from the lower surface 34 of the upper die unit 30, which means the upper supporting pillars 51 are integrally connected with the die 71 of the upper die unit 30. The lower supporting pillars 52 integrally extend from the upper surface 43 of the lower die unit 40, which means the lower supporting pillars 52 are integrally connected with the die 71 of the lower die unit 40. As a result, the supporting pillars being integrally connected with the dies makes the probe seat simple in structure, beneficial for manufacture and assembly, and great in structural strength. However, the supporting pillars are unlimited to be integrally connected with the dies.

In the present invention, the upper and lower die units 30, 40 are unlimited to include the upper and lower recesses 37, 47, which means the supporting pillars are unlimited to be located in the recess. The supporting pillars may protrude from the connecting surfaces 36, 46 of the upper and lower die units 30, 40. In such case, a hollow middle die or other supportive structures can be disposed between the upper and lower die units 30, 40 to form the accommodating space 242 for accommodating the supporting structure 50 and the probes 25. In other words, the accommodating space 242 is only required to be formed around the plurality of supporting pillars, and formed between the upper and lower die units 30, 40. The accommodating space 242 not only accommodates the supporting structure 50, but is also arranged for the probes 25 to be inserted therethrough. More specifically speaking, the plurality of probes 25 of the probe card 20 are inserted through the upper through holes of the upper die unit 30 respectively, inserted through the accommodating space 242, and inserted through the lower through holes of the lower die unit 40 respectively. In the accommodating space 242, where no probe 25 is disposed can be arranged with the supporting pillars.

The upper supporting pillars 51 protrude from the lower surface 34 of the upper die unit 30 along the vertical axis (Z-axis). The lower supporting pillars 52 protrude from the upper surface 43 of the lower die unit 40 along the vertical axis (Z-axis). The upper supporting pillars 51 are in contact with the lower supporting pillars 52 respectively. In the present invention, the contact between the upper and lower supporting pillars 51, 52 includes various kinds of contact manners, such as being abutted on each other, being embedded in each other, being fastened to each other, and so on, as long as the upper and lower supporting pillars 51, 52 are not integrally formed with each other but connected together when the probe seat 24 is assembled.

As a result, the upper and lower supporting pillars 51, 52 protrude from the upper and lower die units 30, 40 respectively, and are in contact with each other. Such upper and lower supporting pillars 51, 52 enhance the structural strength of the upper and lower die units 30, 40 respectively. In addition, when the upper and lower die units 30, 40 are connected with each other, the upper and lower supporting pillars 51, 52 further collectively strengthen the part of the central section of the probe seat 24 with the accommodating space 241 and the resulting lower structural strength. Therefore, the probe seat 24, even in the large-area condition, is great in structural strength and thereby uneasy to be deformed, so that the deformation of the lower die unit 40 caused by the reacting force from the device under test will be reduced.

In addition, the upper and lower die units 30, 40 are the above-described adhered multilayer die units 70, which can attain great structural strength and levelness in the large-area condition, and the upper and lower die units 30, 40 have the above-described flow guiding grooves 725A, which can further ensure that the adhesive will not spill to the probe zones 74 to affect the probes 25.

Furthermore, in the upper and lower die units 30, 40, the flow guiding groove 725A and the adhesive applying region 727 defined thereby correspond in position to the upper and lower supporting pillars 51, 52 along the vertical axis, which means the flow guiding groove 725A and the adhesive applying region 727 defined thereby are located right above or right below the upper and lower supporting pillars 51, 52, such that the upper and lower supporting pillars 51, 52 can directly generate structure strengthening effect to where the flow guiding groove 725A and the adhesive applying region 727 are located, making the die unit further uneasy to be deformed by the received force. The flow guiding groove 725A and the adhesive applying region 727 defined thereby are unlimited to be completely correspond to the upper and lower supporting pillars 51, 52 along the vertical axis. As long as at least a part thereof corresponds to the upper supporting pillar 51 and/or the lower supporting pillar 52 along the vertical axis, structure strengthening effect can be attained by the upper supporting pillar 51 and/or the lower supporting pillar 52.

At last, it should be mentioned again that the constituent elements disclosed in the above embodiments of the present invention are only taken as examples for illustration, not intended to limit the scope of the present invention. The substitution or variation of other equivalent elements should be included within the scope of the following claims of the present invention.

What is claimed is:

1. An adhered multilayer die unit for a probe head of a test system for performing a functional test to a device under test integrated on a semiconductor wafer, wherein the probe head comprises an upper die unit, a lower die unit, and a plurality of probes extending through the upper die unit and the lower die unit, and the adhered multilayer die unit is configured to form at least one of the upper die unit and the lower die unit and comprises at least one probe zone through which the probes extend, and at least one non-probe zone, wherein the adhered multilayer die unit comprises:

a plurality of dies, each of the dies comprising at least one connecting surface, and a plurality of through holes located in the at least one probe zone for the probes to be slidably inserted through the through holes of each of the dies; and at least one adhesive layer adhering the connecting surfaces of the dies to each other, the at least one adhesive layer being entirely located in the at least one non-probe zone.

2. The adhered multilayer die unit as claimed in claim 1, which comprises a plurality of said probe zones arranged in a matrix and one said non-probe zone located on a periphery of the probe zones, or comprises a plurality of said probe zones and a plurality of said non-probe zones, which are distributed in a staggered manner and collectively arranged in a matrix, or comprises a plurality of said non-probe zones arranged in a matrix and one said probe zone distributed in a grid pattern on a periphery of the non-probe zones and between the non-probe zones.

3. The adhered multilayer die unit as claimed in claim 1, wherein the connecting surfaces of the dies comprise a first connecting surface and a second connecting surface, which are adhered to each other; the first connecting surface comprises at least one protrusion located in the at least one non-probe zone; the second connecting surface is a plane and the protrusion of the first connecting surface is adhered to the second connecting surface by the adhesive layer, or the second connecting surface comprises at least one recess located in the at least one non-probe zone and the protrusion of the first connecting surface is adhered in the recess of the second connecting surface by the adhesive layer.

4. The adhered multilayer die unit as claimed in claim 1, wherein the connecting surfaces of the dies comprise a first connecting surface and a second connecting surface, which are adhered to each other; at least one of the first connecting surface and the second connecting surface is provided with at least one flow guiding groove in the non-probe zone; the at least one flow guiding groove is configured to define an adhesive applying region; the at least one flow guiding groove is located between the adhesive applying region and the probe zone; the adhesive layer is located in the adhesive applying region.

5. The adhered multilayer die unit as claimed in claim 4, wherein the at least one flow guiding groove comprises a closed flow guiding groove forming a closed loop.

6. The adhered multilayer die unit as claimed in claim 4, wherein the at least one flow guiding groove comprises a plurality of disconnected flow guiding grooves; the disconnected flow guiding grooves form a disconnected loop.

7. The adhered multilayer die unit as claimed in claim 4, wherein the at least one flow guiding groove comprises at least one inner flow guiding groove forming a loop, and at least one outer flow guiding groove surrounding the at least one inner flow guiding groove.

8. The adhered multilayer die unit as claimed in claim 4, wherein the at least one flow guiding groove comprises a plurality of inner flow guiding grooves forming a disconnected loop, and a plurality of outer flow guiding grooves disconnectedly surrounding the inner flow guiding grooves; every two adjacent said inner flow guiding grooves have a gap therebetween; the outer flow guiding grooves are located correspondingly to the gaps.

9. The adhered multilayer die unit as claimed in claim 4, wherein the flow guiding groove penetrates through the die the flow guiding groove belongs to.

10. The adhered multilayer die unit as claimed in claim 4, wherein the flow guiding groove is recessed from the connecting surface the flow guiding groove is located on.

11. The adhered multilayer die unit as claimed in claim 4, wherein at least one of the first connecting surface and the second connecting surface is further provided with at least one adhesive dropping recess in the non-probe zone; the at least one adhesive dropping recess is located in the adhesive applying region.

12. The adhered multilayer die unit as claimed in claim 4, wherein the plurality of dies comprise an inner layer die and two outer layer dies; the inner layer die comprises two said connecting surfaces facing toward opposite directions; the two outer layer dies are adhered to the connecting surfaces of the inner layer die respectively; the two outer layer dies are each provided with said flow guiding groove; the flow guiding groove penetrates through the outer layer die.

13. The adhered multilayer die unit as claimed in claim 1, wherein the plurality of dies comprise at least two positionally limiting dies and at least one alignment die; the at least two positionally limiting dies and the at least one alignment die are piled on one another in a staggered manner; the through holes of the alignment die are larger in width than the through holes of the positionally limiting dies.

14. The adhered multilayer die unit as claimed in claim 1, wherein the connecting surfaces of the dies comprise a first connecting surface and a second connecting surface, which are adhered to each other; at least one of the first connecting surface and the second connecting surface is provided with at least one adhesive dropping recess in the non-probe zone.

15. The adhered multilayer die unit as claimed in claim 4, wherein the plurality of dies comprise two said dies, at least one of which is provided with said flow guiding groove penetrating therethrough.

16. A probe card for performing a functional test to a device under test, the probe card comprising:

an interface board arranged to interface with a tester;

a space transformer associated with the interface board and adapted for providing space transformation in interval between contact pads formed on two opposite surfaces of the space transformer; and the probe head as claimed in claim 1, which is associated with the space transformer.

17. A test system for testing at least one device under test, the device under test comprising a plurality of electrically conductive contacts, the test system comprising:

a chuck for supporting the at least one device under test;

a probe card comprising a probe head as claimed in claim 1 for the probes of the probe head to be in contact with the electrically conductive contacts of the at least one device under test, such that the probe card is electrically connected with the at least one device under test; and a tester electrically connected with the probe card for generating a test signal for the probe card to transmit the test signal to the at least one device under test, and receiving a result signal through the probe card and analyzing the result signal.

* * * * *